United States Patent
Rizzo et al.

(10) Patent No.: US 8,890,734 B2
(45) Date of Patent: Nov. 18, 2014

(54) ANALOG TO DIGITAL CONVERSION

(75) Inventors: Francesco Rizzo, Adliswil (CH); Shyam Somayajula, Bangalore (IN)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/878,331

(22) PCT Filed: Oct. 25, 2011

(86) PCT No.: PCT/EP2011/068612
§ 371 (c)(1),
(2), (4) Date: Jun. 29, 2013

(87) PCT Pub. No.: WO2012/055848
PCT Pub. Date: May 3, 2012

(65) Prior Publication Data
US 2013/0271303 A1    Oct. 17, 2013

Related U.S. Application Data

(60) Provisional application No. 61/436,307, filed on Jan. 26, 2011.

(30) Foreign Application Priority Data

Oct. 29, 2010   (IN) ............................ 2590/DEL/2010
Jan. 24, 2011   (EP) ..................................... 11151855

(51) Int. Cl.
  *H03M 3/00*    (2006.01)
  *H03G 1/00*    (2006.01)
(52) U.S. Cl.
  CPC .............. *H03M 3/458* (2013.01); *H03M 3/484* (2013.01); *H03G 1/0035* (2013.01); *H03G 1/0094* (2013.01)
  USPC .......................................... 341/143; 341/155

(58) Field of Classification Search
  CPC .............................. H03M 3/484; H03M 3/458
  USPC ................................................... 341/143, 155
  See application file for complete search history.

(56) References Cited

U.S. PATENT DOCUMENTS 5,134,401 A    7/1992   McCartney et al.
5,363,055 A    11/1994  Ribner
(Continued)

FOREIGN PATENT DOCUMENTS

EP          1 965 496 A2    9/2008

OTHER PUBLICATIONS

Francesco Rizzo, et al.; "Audio Telecom ADC Featuring Click-Free Gain Control Technique, Dithering Insertion, and Idle Tone Shifting"; IEEE Transaction on Instrumentation and Measurement, vol. 61, No. 11; Nov. 2012; pp. 2879-2887; Zurich, Switzerland.

(Continued)

*Primary Examiner* — Jean B Jeanglaude
(74) *Attorney, Agent, or Firm* — Patent Portfolio Builders PLLC

(57) ABSTRACT

A delta-sigma analog-to-digital converter includes: a summing stage having a first input for an input signal and a second input for a feedback signal; an integrator coupled to an output of the summing stage; an analog-to-digital conversion stage coupled to an output of the integrator; and a switchable gain stage coupled in a feedback path between an output of the analog-to-digital conversion stage and the second input of the summing stage. The switchable gain stage is arranged to switch, responsive to a gain selection signal, between a first gain and a second gain via a transition period comprising time periods during which the switchable gain stage has the first gain interleaved with time periods during which the switchable gain stage has the second gain.

20 Claims, 15 Drawing Sheets

(56) References Cited

U.S. PATENT DOCUMENTS

| | | | |
|---|---|---|---|
| 6,055,168 A | | 4/2000 | Kotowski et al. |
| 6,504,349 B2 | | 1/2003 | Jaworski |
| 6,999,014 B2 | * | 2/2006 | Oliaei et al. .................. 341/143 |
| 7,142,142 B2 | | 11/2006 | Petersen et al. |
| 7,315,200 B2 | | 1/2008 | Holberg et al. |
| 7,492,296 B1 | * | 2/2009 | Drakshapalli et al. ........ 341/139 |
| 2005/0184895 A1 | | 8/2005 | Petersen et al. |
| 2007/0142016 A1 | | 6/2007 | Womac et al. |

OTHER PUBLICATIONS

Francesco Rizzo, et al.; "Audio ADC for mobile applications featuring a novel gain control technique, dithering insertion and idle tones shifting"; 2011 International Workshop on ADC Modeling, Testing and Data Converter Analysis and Design; IEEE 2011 ADC Forum; Jun. 30-Jul. 1, 2011; pp. 185-190; Orvieto, Italy.

International Search Report issued in corresponding International application No. PCT/EP2011/068612, date of mailing Apr. 11, 2012.

Rao, Arun, et al., "Noise-Shaping Techniques Applied to Switched-Capacitor Voltage Regulators," IEEE Journal of Solid-State Circuits, vol. 40, Issue: 2, Feb. 2005.

* cited by examiner

| Capacitive element | $C_x$ | $C_1$ | $C_2$ | $C_3$ | $C_4$ | $C_5$ | $C_6$ | $C_7$ | |
|---|---|---|---|---|---|---|---|---|---|
| Capacitance units | 1 | 0.125 | 0.25 | 0.50 | 1 | 2 | 4 | 8 | Total Capacitance units |
| Gain setting | Feedback Gain, G (dB) | | | | | | | | |
| 1 | 0 | X | | | | | | | X | 12.00 |
| 2 | -2 | X | | | | | | | X | 9.50 |
| 3 | -4 | X | X | | | | | | | 7.625 |
| 4 | -6 | X | | | | X | | | | 6.00 |
| 5 | -8 | X | | X | | X | X | | | 4.75 |
| 6 | -10 | X | X | X | X | | X | | | 3.75 |
| 7 | -12 | X | X | X | | X | | X | | 3.00 |
| 8 | -14 | X | X | | X | X | | | | 2.375 |
| 9 | -16 | X | | | X | | X | | | 1.875 |
| 10 | -18 | X | | X | | | | | | 1.50 |
| 11 | -20 | X | | | | | | | | 1.25 |

FIG. 11

| Capacitive element | $C_x$ | $C_1$ | $C_2$ | $C_3$ | $C_4$ | $C_5$ | $C_6$ | $C_7$ | $C_8$ | $C_9$ | $C_{10}$ | $C_{11}$ | |
|---|---|---|---|---|---|---|---|---|---|---|---|---|---|
| Capacitance units | 1 | 0.25 | 0.5 | 0.875 | 1.375 | 2 | 2.75 | 3.75 | 5 | 6.625 | 8.5 | 11 | Total capacitance units |
| Gain setting | Feedback Gain, G (dB) | | | | | | | | | | | | |
| 1 | 0 | | | | | | | | | | | X | 12.00 |
| 2 | -2 | X | | | | | | | | | X | | 9.50 |
| 3 | -4 | X | | | | | | | | X | | | 7.625 |
| 4 | -6 | X | | | | | | | | | | | 6.00 |
| 5 | -8 | X | | | | | | | X | | | | 4.75 |
| 6 | -10 | X | | | | | | X | | | | | 3.75 |
| 7 | -12 | X | | | | | X | | | | | | 3.00 |
| 8 | -14 | X | | | | X | | | | | | | 2.375 |
| 9 | -16 | X | | | X | | | | | | | | 1.875 |
| 10 | -18 | X | | X | | | | | | | | | 1.50 |
| 11 | -20 | X | X | | | | | | | | | | 1.25 |
| 12 | -22 | X | | | | | | | | | | | 1.00 |

ANALOG TO DIGITAL CONVERSION

FIELD OF THE DISCLOSURE

The present disclosure relates to a delta-sigma analog-to-digital converter and to an apparatus comprising a delta-sigma analog-to-digital converter. In particular, the delta-sigma analog-to-digital converter is adapted for gain control. The present disclosure also relates to a method of controlling the gain of a delta-sigma analog-to-digital converter.

BACKGROUND TO THE DISCLOSURE

Delta-sigma analog-to-digital converters, also known as sigma-delta analog-to-digital converters, are used to provide high resolution data conversion. A typical first order delta-sigma analog-to-digital converter (ADC) is illustrated in FIG. 1. It comprises an ADC input 310 for an analog input signal and an ADC output 350 for a digital output signal. The ADC input 310 is coupled to a first input of a summing stage 320, and an output of the summing stage 320 is coupled to an input of an integrator 330. An output of the integrator 330 is coupled to an input of an analog-to-digital conversion stage 340, denoted A/D in FIG. 1, and an output of the analog-to-digital conversion stage 340 is coupled to the ADC output 350. A digital-to-analog conversion stage 360 is coupled in a feedback path between the ADC output 350 and a second input of the summing stage 320. More specifically, the digital-to-analog conversion stage 360 has an input coupled to the ADC output 350 and an output coupled to the second input of the summing stage 320 for delivering a feedback signal. The second input of the summing stage 320 is an inverting input, and therefore the output of the summing stage 320 delivers to the input of the integrator 330 the difference between the analog input signal and the feedback signal, known as an error signal. For a one-bit ADC, the analog-to-digital conversion stage 340 can comprise a limiter for generating the digital output signal as a binary signal indicative of whether the signal at the output of the integrator 330 is above or below a threshold. For a one-bit ADC, the digital-to-analog conversion stage 360 can comprise a switch 365 controlled by the digital output signal and delivering to the second input of the summing stage 320 either of two reference voltages, $V_{REF+}$ and $V_{REF-}$, according to the binary value of the digital output signal. The portion of the feedback path from the digital-to-analog conversion stage 360 to the second input of the summing stage 320 may be referred to as the reference voltage path.

A typical third order feed forward delta-sigma ADC is illustrated in FIG. 2, with components similar to those of the first order delta-sigma ADC illustrated in FIG. 1 having the same reference numerals. The third order feed forward delta-sigma ADC comprises the ADC input 310 for the analog input signal and the ADC output 350 for the digital output signal. The ADC input 310 is coupled to the first input of the summing stage 320 via a first amplification stage 315 having a gain g1, and an output of the summing stage 320 is coupled to an input of a first integrator 330a. An output of the first integrator 330a is coupled to an input of a second integrator 330b having a gain g2, and an output of the second integrator 330b is coupled to an input of a third integrator 330c having a gain g3. Outputs of the first, second and third integrators 330a, 330b, 330c are coupled to respective inputs of a combining stage 316 via respective second, third and fourth amplification stages 331a, 331b and 331c having respective summing coefficients s1, s2 and s3. An output of the combining stage 316 is coupled to an input of the analog-to-digital conversion stage 340, and an output of the analog-to-digital conversion stage 340 is coupled to the ADC output 350. The analog-to-digital conversion stage 340 can comprise a limiter for generating the digital output signal as a binary signal indicative of whether the signal at the output of the combining stage 316 is above or below a threshold $Q_n$. The feedback path comprising the digital-to-analog conversion stage 360 is coupled between the ADC output 350 and a second input of the summing stage 320 for delivering the feedback signal. The digital-to-analog conversion stage 360 has a gain gref, also referred to as the gref coefficient. The second input of the summing stage 320 is an inverting input, and therefore the output of the summing stage 320 delivers to the input of the first integrator 330a the difference between the analog input signal and the feedback signal. The principles of operation of the third order delta-sigma ADC illustrated in FIG. 2 are well documented and will not be repeated here.

There is a requirement to vary the gain of a delta-sigma ADC, in particular to provide low noise data conversion for analog input signals of different amplitudes. Controlling the gain in a delta sigma ADC may be done by acting on the feedback path and tuning the fraction of a reference voltage which is subtracted from the analog input signal to determine the error signal. Some solutions implement gain control of the signal path using a programmable gain amplifier, which will set the input to the delta sigma ADC to the desired amplitude. Therefore, one way of providing gain control is to provide a switchable gain amplifier between the ADC input 310 and the first input of the summing stage 320. However, switching the gain in steps can introduce distortion to the analog input signal undergoing analog-to-digital conversion. For example, audible artefacts may be introduced into an audio signal.

The disclosure relates to improvements in analog-to-digital conversion.

SUMMARY OF THE PREFERRED EMBODIMENTS

According to a first aspect, there is provided a delta-sigma analog-to-digital converter, comprising:
a summing stage having a first input for an input signal and a second input for a feedback signal;
an integrator coupled to an output of the summing stage;
an analog-to-digital conversion stage coupled to an output of the integrator; and
a switchable gain stage coupled in a feedback path between an output of the analog-to-digital conversion stage and the second input of the summing stage;
wherein the switchable gain stage is arranged to switch, responsive to a gain selection signal, between a first gain and a second gain via a transition period comprising time periods during which the switchable gain stage has the first gain interleaved with time periods during which the switchable gain stage has the second gain, wherein the time periods at the first gain comprise periods that decrease in duration over the transition period and the time periods at the second gain comprise periods that increase in duration over the transition period.

According to a second aspect, there is provided a method of controlling the gain of a delta-sigma analog-to-digital converter comprising a summing stage having a first input for an input signal and a second input for a feedback signal, an integrator coupled to an output of the summing stage, an analog-to-digital converter coupled to an output of the integrator and a switchable gain stage coupled in a feedback path between an output of the analog-to-digital conversion stage and the second input of the summing stage, the method comprising:

switching the switchable gain stage, responsive to a gain selection signal, between a first gain and a second gain via a transition period comprising time periods during which the switchable gain stage is at the first gain interleaved with time periods during which the switchable gain stage is at the second gain, wherein the time periods at the first gain comprise periods that decrease in duration over the transition period and the time periods at the second gain comprise periods that increase in duration over the transition period.

Therefore, during the transition period time periods at the first gain are interleaved with time periods at the second gain. Over the transition period, the duration of the time periods at the first gain decrease and the duration of the time periods at the second gain increase. Therefore, over the transition period, the proportion of time at the first gain may decrease and the proportion of time at the second gain may increase. The action of the integrator may have a smoothing effect, producing the effect of a smooth change of gain of the signal in the delta-sigma ADC between the first gain and the second gain. In this way, the effect of a smooth change of gain can be provided using only two gain settings by switching between the two gain settings.

The switchable gain stage can comprise a switchable capacitance stage switchable between a first capacitance value for determining the first gain and a second capacitance value for determining the second gain, and a controller for switching the switchable capacitance stage between the first and second capacitance values for the time periods of the first transition period. Likewise, where the switchable gain stage comprises a switchable capacitance stage switchable between a first capacitance value for determining the first gain and a second capacitance value for determining the second gain, the method can comprise switching the switchable capacitance stage between the first and second capacitance values for the time periods of the first transition period. This enables a low complexity implementation, in particular where the delta-sigma ADC is implemented using switched capacitor techniques for sampling the input signal and feedback signal.

In one embodiment, the switchable capacitance stage can comprise a first capacitive element individually selectable for determining the first capacitance value and a second capacitive element individually selectable for determining the second capacitance value. Likewise, the method can comprise selecting a first capacitive element individually for determining the first capacitance value and selecting a second capacitive element individually for determining the second capacitance value. By individually selecting capacitive elements, the number of capacitive elements that are switched can be minimised, and therefore electrical noise generated by switching the capacitive elements can be reduced.

In another embodiment, the switchable capacitance stage can comprise a plurality of capacitive elements selectable in a first combination for determining the first capacitance value and in a second combination for determining the second capacitance value. Likewise, the method can comprise selecting from a plurality of capacitive elements a first combination of capacitive elements for determining the first capacitance value and a second combination of capacitive elements for determining the second capacitance value. By selecting combinations of capacitive elements, the number of capacitance values that can be selected can be increased, and therefore the number of switchable gain values can be increased.

Indeed, the switchable capacitance stage can comprise a plurality of capacitive elements selectable in a plurality of combinations for determining different capacitance values of the switchable capacitance stage, and the plurality of capacitive elements can have different capacitance values related by an integer power of two. Such a distribution of capacitance values enables a high resolution of gain values to be selected using a small number of capacitive elements.

The switchable gain stage can comprise a switchable resistance stage switchable between a first resistance value for determining the first gain and a second resistance value for determining the second gain, and a controller for switching the switchable resistance stage between the first and second resistance values for the time periods of the first transition period. Likewise, where the switchable gain stage comprises a switchable resistance stage switchable between a first resistance value for determining the first gain and a second resistance value for determining the second gain, the method can comprise switching the switchable resistance stage between the first and second resistance values for the time periods of the first transition period. This enables a low chip area where the delta-sigma ADC is implemented in an integrated circuit, in particular for use with low frequency signals where the resistance values can require a smaller area than capacitance values would require.

The time periods of the transition period during which the switchable gain stage has the first gain may alternate with the time periods of the transition period during which the switchable gain stage has the second gain. This enables a low complexity implementation.

The feedback path may comprise a reference voltage selection means for coupling, responsive to an output signal at the output of the analog-to-digital conversion stage, a first reference voltage or a second reference voltage to the second input via the switchable gain stage. This enables a low complexity implementation of digital-to-analog conversion in the feedback path of the delta-sigma ADC.

The disclosure also extends to a device comprising a delta-sigma analog-to-digital converter according to the first aspect of the invention. Such a device may be, for example, a mobile phone, an audio recorder, a camera or a video recorder, or an integrated circuit for use in such equipments.

According to a third aspect, there is provided a system for switching the gain in a delta-sigma analog-to-digital converter, comprising a decode block for, responsive to a step function applied to a gain control input, pulse width modulating a switching control signal controlling the gain amplitude.

According to a fourth aspect, there is provided a method for switching the gain in a delta-sigma analog-to-digital converter, comprising, responsive to a step function applied to a gain control input, pulse width modulating a switching control signal controlling the gain amplitude.

By pulse width modulating the switching control signal, when the gain is switched between a first value and a second value, the proportion of time spent at each of the first and second values can be varied, thereby enabling a gradual transition from the first value to the second value.

The system can comprise a plurality of capacitors each controlled by a dedicated switch to allow gain stepping. This enables a low complexity implementation, in particular where the delta-sigma ADC is implemented using switched capacitor techniques for sampling the input signal and feedback signal.

The plurality of capacitors can be selectable individually. This enables the number of capacitors that are switched to be minimised, and therefore electrical noise generated by switching the capacitors to be reduced.

The plurality of capacitors can be selectable in a plurality of combinations. This enables the number of capacitance values that can be selected to be increased, and therefore the number of switchable gain values to be increased.

The plurality of capacitors can have the weight $2^N$, $N\epsilon(0, 1, 2, 3 \ldots)$. This enables a high resolution of gain values to be selected using a small number of capacitors.

According to a fifth aspect, there is provided a delta-sigma analog-to-digital converter comprising:

a summing stage having a first input for an input signal and a second input for a feedback signal;

an integrator coupled to an output of the summing stage;

an analog-to-digital conversion stage coupled to an output of the integrator; and a switchable gain stage coupled in a feedback path between an output of the analog-to-digital conversion stage and the second input of the summing stage;

wherein the switchable gain stage is arranged to switch, responsive to a gain selection signal, between a first gain and a second gain via a transition period comprising time periods during which the switchable gain stage has the first gain interleaved with time periods during which the switchable gain stage has the second gain, wherein the time periods at the first gain comprise time periods that decrease in duration over the transition period and the time periods at the second gain comprise time periods that increase in duration over the transition period;

wherein the switchable gain stage comprises the system according to the third aspect, wherein the gain selection signal comprises the step function applied to the gain control input, and wherein the switchable gain stage is arranged to switch between the first gain and the second gain via the transition period in response to the switching control signal.

The switchable gain stage of the delta-sigma analog-to-digital converter according to the fifth aspect can comprise a plurality of capacitors each controlled by a dedicated switch to allow gain stepping. In particular, the switchable gain stage can comprise a switchable capacitance stage comprising the plurality of capacitors, and the switchable capacitance stage can be switchable between a first capacitance value for determining the first gain and a second capacitance value for determining the second gain, and the decode block can be arranged to switch the switchable capacitance stage between the first and second capacitance values for the time periods of the transition period.

The plurality of capacitors of the switchable gain stage of the delta-sigma analog-to-digital converter according to the fifth aspect can be selectable individually. In particular, the plurality of capacitors can comprise a first capacitive element individually selectable for determining the first capacitance value and a second capacitive element individually selectable for determining the second capacitance value.

The plurality of capacitors of the switchable gain stage of the delta-sigma analog-to-digital converter according to the fifth aspect can be selectable in a plurality of combinations. In particular, the plurality of capacitors can be selectable in a first combination for determining the first capacitance value and in a second combination for determining the second capacitance value.

The plurality of capacitors of the switchable gain stage of the delta-sigma analog-to-digital converter according to the fifth aspect can have the weight $2^N$, $N\epsilon(0, 1, 2, 3 \ldots)$. In particular, the plurality of capacitors can be selectable in a plurality of combinations for determining different capacitance values of the switchable capacitance stage, and the plurality of capacitive elements have different capacitance values related by an integer power of two.

According to a sixth aspect, there is provided a method of controlling the gain of a delta-sigma analog-to-digital converter comprising a summing stage having a first input for an input signal and a second input for a feedback signal, an integrator coupled to an output of the summing stage, an analog-to-digital converter coupled to an output of the integrator, a switchable gain stage coupled in a feedback path between an output of the analog-to-digital conversion stage and the second input of the summing stage, wherein the switchable gain stage comprises the system according to the third aspect, the method comprising:

switching the switchable gain stage, by pulse width modulating a switching control signal controlling the gain amplitude responsive to a gain selection signal comprising the step function applied to the gain control input, between a first gain and a second gain via a transition period comprising time periods during which the switchable gain stage is at the first gain interleaved with time periods during which the switchable gain stage is at the second gain, wherein the time periods at the first gain comprise periods that decrease in duration over the transition period and the time periods at the second gain comprise periods that increase in duration over the transition period.

In one embodiment, successive ones of the time periods at the first gain can decrease in duration over the transition period and successive ones of the time periods at the second gain, interleaved with the successive time periods at the first gain, can increase in duration over the transition period.

In another embodiment, successive ones of the time periods at the first gain can comprise first groups of the time periods at the first gain, wherein the time periods at the first gain within each first group have an equal duration and wherein the time periods of successive ones of the first groups decrease in duration over the transition period, and successive ones of the time periods at the second gain interleaved with the successive time periods at the first gain can comprise second groups of the time periods at the second gain, wherein the time periods at the second gain within each second group have an equal duration and wherein the time periods of successive ones of the second groups decrease in duration over the transition period.

BRIEF DESCRIPTION OF THE DRAWINGS

Preferred embodiments will now be described, by way of example only, with reference to the accompanying drawings, in which:

FIG. 11 is a table illustrating selectable combinations of selectable capacitive elements;

FIG. 12 is a table illustrating selectable capacitive elements that are individually selectable;

DETAILED DESCRIPTION OF PREFERRED EMBODIMENTS

Figure 3:
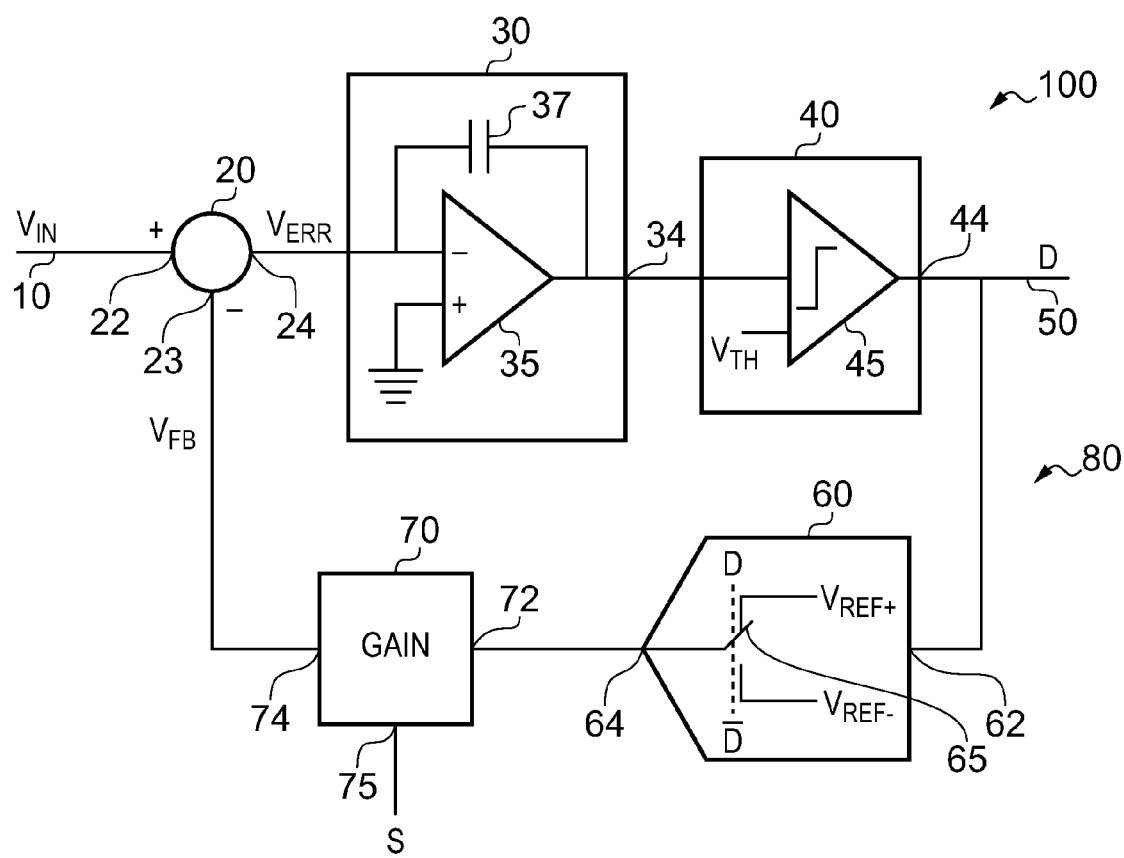
FIG. 3 is a block diagram of a delta-sigma analog-to-digital converter with gain control.

Referring to FIG. 3, a delta-sigma analog-to-digital converter 100 comprises an ADC first input 10 for an analog input signal $V_{IN}$ and an ADC output 50 for a digital output signal D. The ADC first input 10 is coupled to a first input 22, which non-inverting, of a summing stage 20, and an output of the summing stage 20 is coupled to an input of an integrator 30. An output 34 of the integrator 30 is coupled to an input of an analog-to-digital conversion (A/D) stage 40, and an output 44 of the A/D stage 40 is coupled to the ADC output 50. A digital-to-analog conversion (D/A) stage 60 has an input 62 coupled to the ADC output 50 and a first output 64 coupled to a first input 72 of a switchable gain stage 70.

The switchable gain stage 70 has an output 74 coupled to a second input 23, which is inverting, of the summing stage 20 for delivering a feedback signal $V_{FB}$ to the summing stage 20. The switchable gain stage 70 has a gain control input 75 for a gain selection signal S, and in response to the gain selection signal S the switchable gain stage switches the gain in the delta-sigma analog-to-digital converter 100. The output 24 of the summing stage 20 delivers to the input of the integrator 30 an error signal $V_{ERR}$ which is the difference between the analog input signal $V_{IN}$ and the feedback signal $V_{FB}$. The signal path between the ADC output 50 and the second input 23 of the summing stage 20, which includes the D/A stage 60 and the switchable gain stage 70, constitutes a feedback path 80.

The integrator 30 comprises an amplifier 35 having a non-inverting input coupled to ground and an inverting input coupled to the input of the integrator 30. An output of the amplifier 35 is coupled to the output 34 of the integrator 30. A feedback capacitor 37 is coupled between the inverting input of the amplifier 35 and the output of the amplifier 35.

The A/D stage 40 comprises a limiter 45 for generating the digital output signal D as a binary signal indicative of whether the signal at the output 34 of the integrator 30 is above or below a threshold $V_{TH}$.

The D/A stage 60 comprises a switch 65 controlled by the digital output signal D and delivering to the first input 72 of the switchable gain stage 70 either of a first reference voltage $V_{REF+}$ or a second reference voltage $V_{REF-}$, according to the binary value of the digital output signal D.

The summing stage 20 can comprise, for example, a first resistive element coupled between the first input 22 of the summing stage 20 and the output 24 of the summing stage 20, and a second resistive element coupled between the second input 23 of the summing stage 20 and the output 24 of the summing stage 20.

Figure 4:
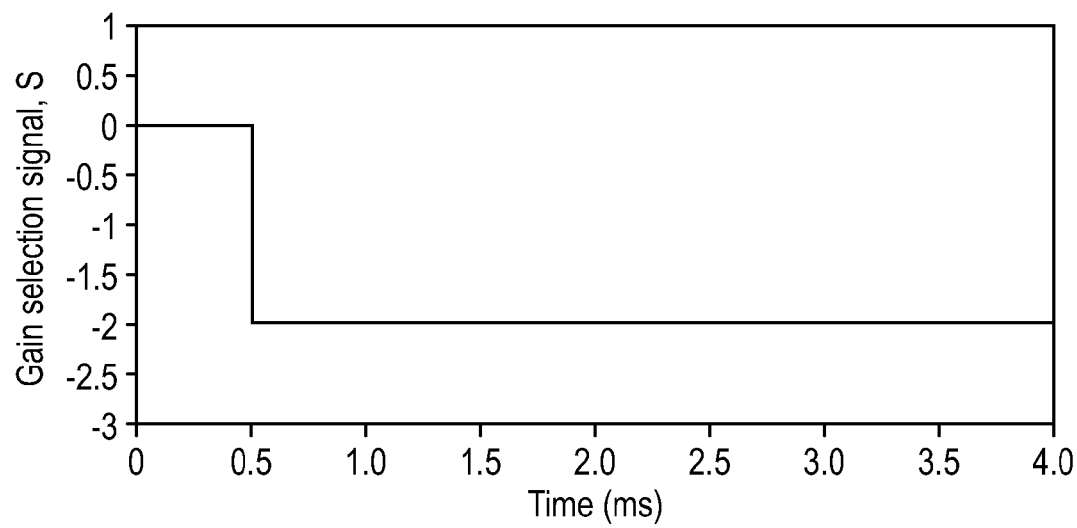
FIG. 4 is a graph illustrating a gain selection signal for a single gain step.
Figure 5:
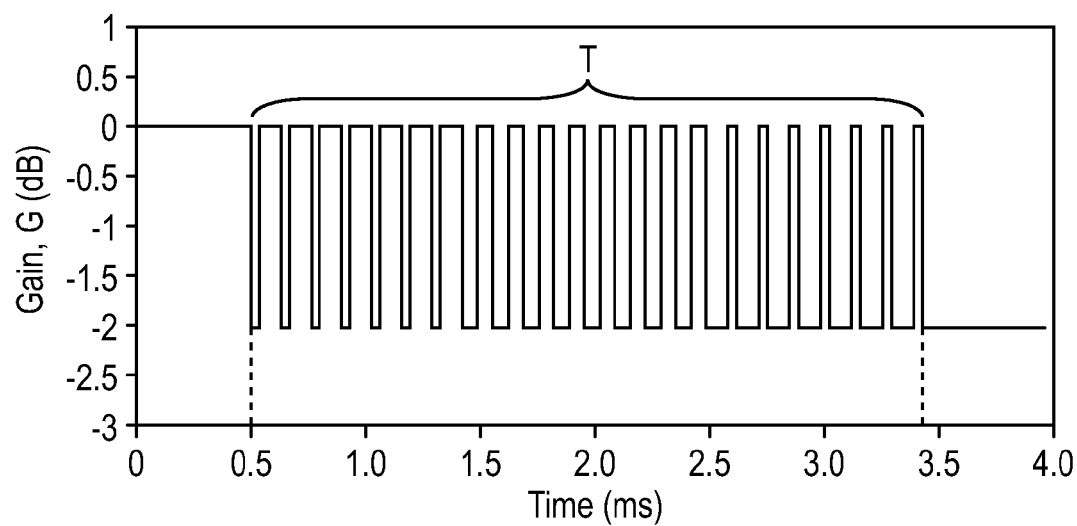
FIG. 5 is a graph illustrating gain switching in a transition period.

FIG. 4 illustrates the gain selection signal S switching from indicating an initial gain G of 0 dB to a target gain G of −2 dB at time 0.5 ms. FIG. 5 illustrates the change in gain G provided by the switchable gain stage 70 in response to the gain selection signal S illustrated in FIG. 4. In response to the change in the gain G indicated by the gain selection signal S at time 0.5 ms, a transition period T commences. During the transition period T, the switchable gain stage 70 switches the gain G in the delta-sigma analog-to-digital converter 100 repeatedly between the initial gain G value of 0 dB and the target gain G value of −2 dB. Therefore, the transition period T comprises time periods during which the switchable gain stage 70 has the initial gain G of 0 dB interleaved with time periods during which the switchable gain stage 70 has the target gain G of −2 dB. The time periods at the initial gain G comprise time periods that decrease in duration over the transition period T, and the time periods at the target gain G comprise time periods that increase in duration over the transition period T. In this way, the duration of the time periods at the initial gain G and the target gain G is modulated. As illustrated in FIG. 5, the transition period can include a plurality of successive time periods at the initial gain G having an equal duration, interleaved with a plurality of successive time periods at the target gain G having an equal duration. That is, successive ones of the time periods at the first gain can comprise first groups of the time periods at the first gain, wherein the time periods at the first gain within each first group have an equal duration and wherein the time periods of successive ones of the first groups decrease in duration over the transition period, and successive ones of the time periods at the second gain interleaved with the successive time periods at the first gain can comprise second groups of the time periods at the second gain, wherein the time periods at the second gain within each second group have an equal duration and wherein the time periods of successive ones of the second groups decrease in duration over the transition period.

Alternatively, each successive time period at the initial gain G can decrease in duration and each successive time period at the target gain G can increase in duration throughout the transition period T. That is, successive ones of the time periods at the first gain can decrease in duration over the transition period and successive ones of the time periods at the second gain, interleaved with the successive time periods at the first gain, can increase in duration over the transition period.

The transition period T terminates at time 3.44 ms approximately, from which time the gain G provided by the switchable gain stage 70 is constant at the target value of −2 dB. The action of the integrator 30 in the delta-sigma analog-to-digital converter 100 provides a smoothing effect on the switching of the gain G during the transition period T, and the resulting effect is a smooth change of gain between the initial gain G and the target gain G over the transition period T.

Figure 6:
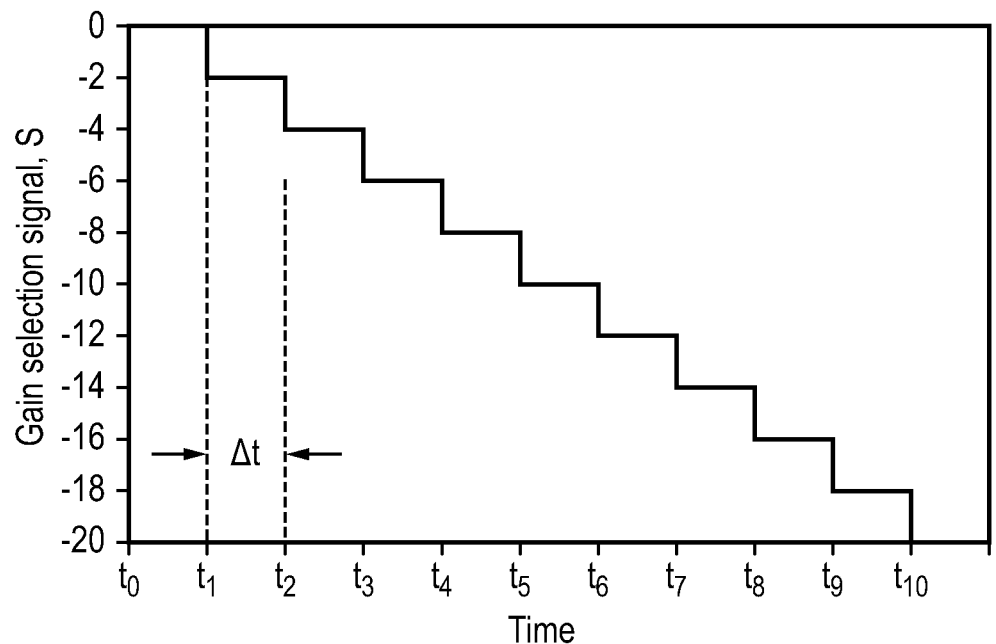
FIG. 6 is a graph illustrating a gain selection signal for a plurality of gain steps.
Figure 7:
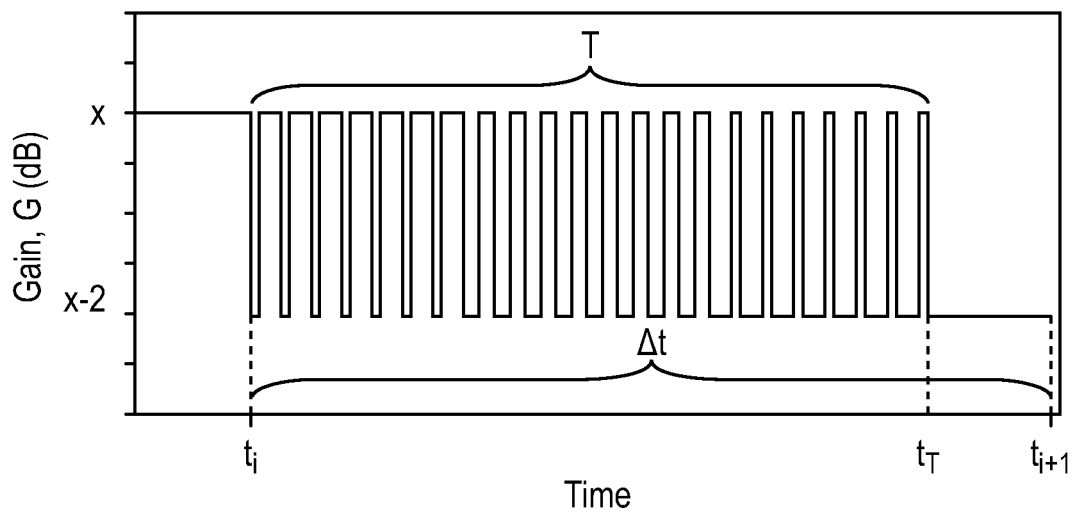
FIG. 7 is a graph illustrating gain switching in a transition period.

Larger changes in gain can be provided by repeating the gain switching illustrated in FIGS. 4 and 5 for different gain values. For example, FIG. 6 illustrates the gain selection signal S switching from indicating an initial gain G of 0 dB to a final gain G of −20 dB in steps of −2 dB. At time $t_0$ the gain selection signal S indicates an initial gain G of 0 dB. At times $t_i$, i=1 to 10, corresponding to equal time intervals of duration Δt, the gain selection signal S selects a progressively reducing gain. FIG. 7 illustrates the change in gain G provided by the switchable gain stage 70 in response to each gain step indicated by the gain selection signal S. At each of the times $t_i$, i=1 to 10, a transition period T commences comprising time periods during which the switchable gain stage 70 has an initial gain G of xdB interleaved with time periods during which the switchable gain stage 70 has a target gain G of x−2 dB. The value of x is zero for the transition period T commencing at time $t_1$, and decreases by 2 dB at each subsequent transition period T. The time periods at the initial gain G of xdB comprise time periods that decrease in duration over the transition period T, and the time periods at the target gain G of x−2 dB comprise time periods that increase in duration over the transition period T. The transition period T terminates at time $t_T$, from which point the gain remains at the target gain G of x−2 dB until time $t_{i+1}$ at which point a new transition period commences. The value of x decreases by 2 dB at each of the times $t_i$, i=2 to 10, that is at the commencement of each transition period T after the first transition period T which commences at time $t_1$.

Although in FIG. 7, commencing at time $t_T$, a period at a constant gain of x−2 dB is illustrated following the transition period T, at the end of the time interval Δt, such a period is not essential, and the transition period T may alternatively continue to the end of the time interval Δt.

Although in FIG. 6 the times $t_i$, i=1 to 10, corresponding to equal time intervals of duration Δt, at least some of the times $t_i$, i=1 to 10 may alternatively be spaced apart at non-equal time intervals.

Figure 8:
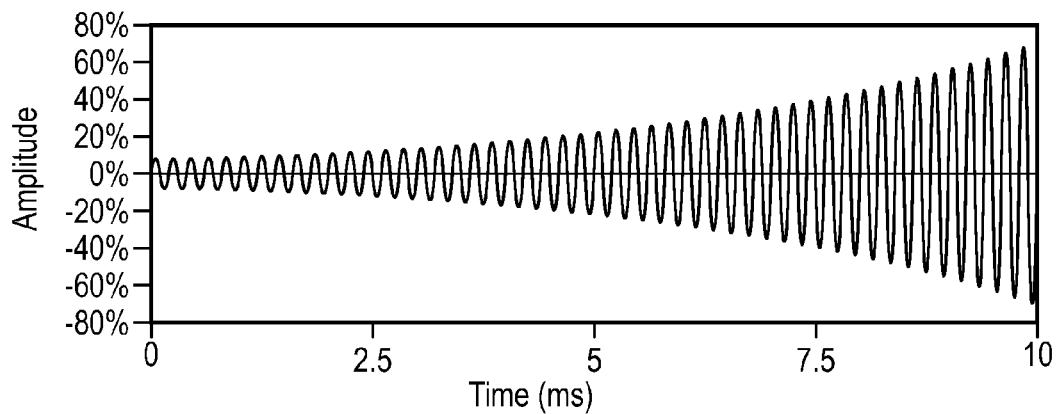
FIG. 8 is a graph illustrating a reconstructed output signal with gain switching in transition periods.

FIG. 8 illustrates the digital output signal D after reconstruction by passing it through a non-illustrated low pass filter, for the case in which the analog input signal $V_{IN}$ is at a constant level of −20 dB, and the gain G of the switchable gain stage 70 in the feedback path 80 is switched from 0 db to −20 dB in steps of −2 dB over a time period of 10 ms, with the transition period T executed at each step, as explained above with reference to FIGS. 4 to 7, and each time interval Δt being 0.9 ms. As the gain G of the switchable gain stage 70 decreases, the amplitude of the feedback signal $V_{FB}$ decreases, the amplitude of the error signal $V_{ERR}$ increases, the loop gain of the delta-sigma ADC 100 increases, and therefore the amplitude of the reconstructed digital output signal increases. In FIG. 8, the amplitude of the reconstructed digital output signal D is expressed as a percentage of the amplitude of the analog input signal $V_{IN}$. The increase in amplitude of the reconstructed digital output signal D is gradual due to the smoothing effect of switching the gain of the switchable gain stage 70 during each transition period T as described.

Figure 9:
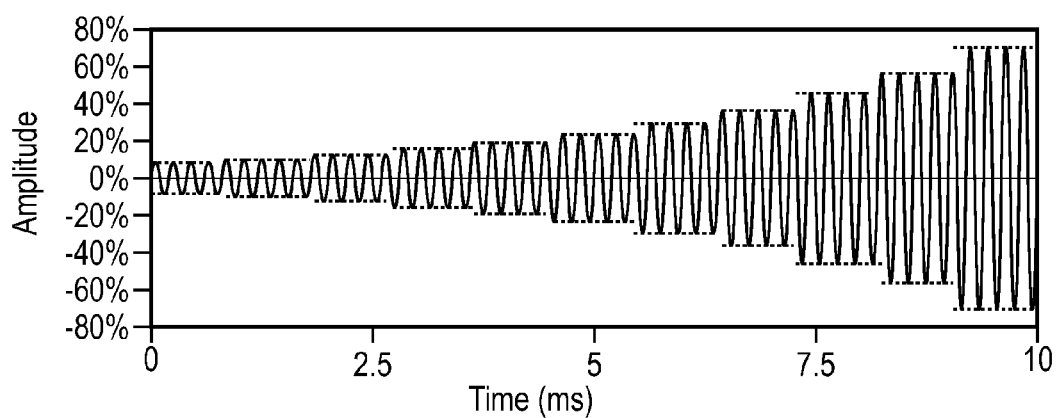
FIG. 9 is a graph illustrating a reconstructed output signal without gain switching transition periods.

For comparison, FIG. 9 illustrates the corresponding digital output signal D after reconstruction if the gain of the switchable gain stage 70 is simply reduced by 2 dB in each time interval Δt in the same manner as the stepping of the gain selection signal S in FIG. 6, without providing the transition periods T illustrated in FIG. 7. The envelope of the reconstructed digital output signal D is indicated in FIG. 9 with horizontal dashed lines denoting each time interval Δt of 0.9 ms, and it can be seen that the amplitude changes abruptly at the commencement of each step in gain. In the examples of FIGS. 8 and 9, the transition period is about 0.9 ms, in contrast to the example of FIG. 5 in which a transition period of about 2.94 ms is illustrated.

Figure 10:
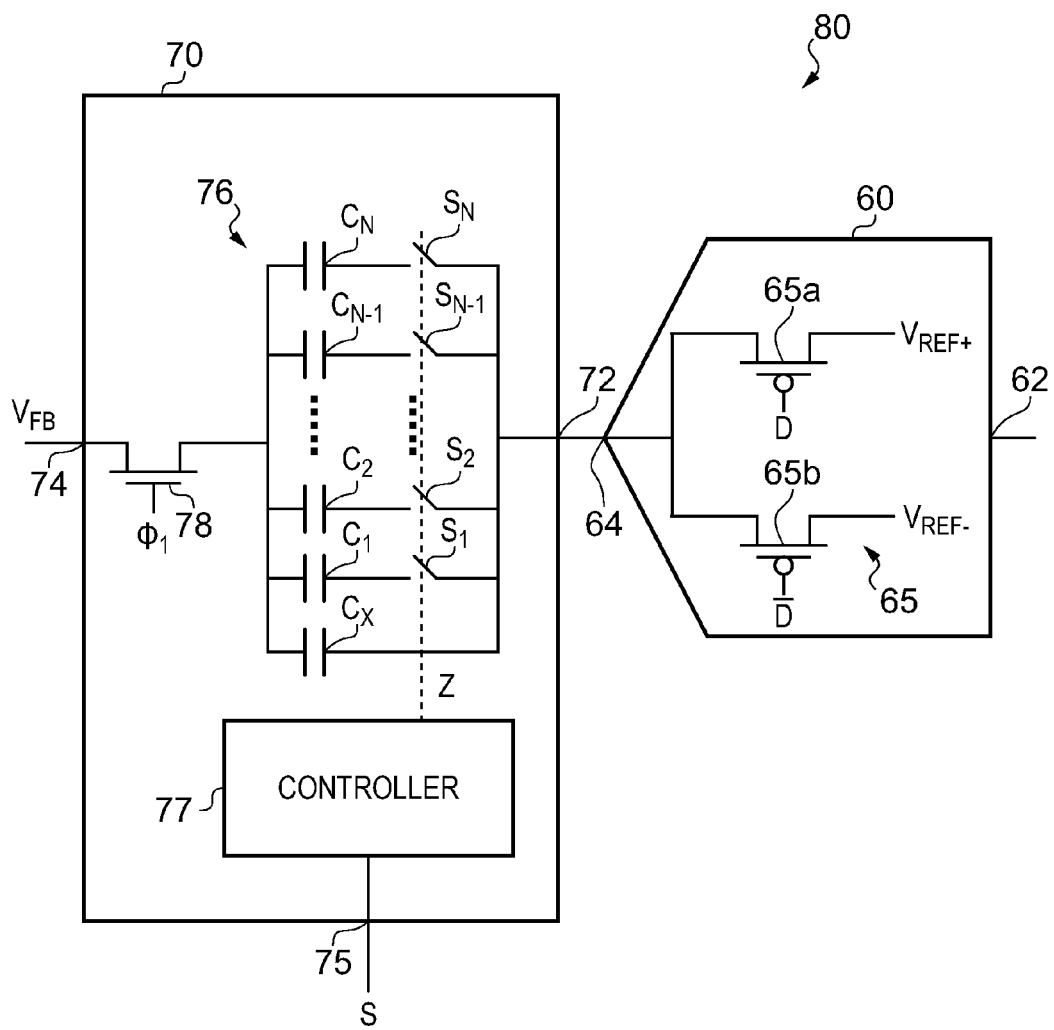
FIG. 10 is a schematic diagram of a feedback path.

FIG. 10 illustrates an embodiment of the feedback path 80 of the delta-sigma ADC 100 illustrated in FIG. 3. The feedback path 80 comprises the D/A stage 60 and the switchable gain stage 70. The embodiment illustrated in FIG. 10 is suitable for use in a switched capacitor delta-sigma ADC in which the analog input signal $V_{IN}$ is sampled by charging a capacitor during a first phase $\Phi_1$ of a clock signal, and the sample is transferred to the integrator 30 during a second phase $\Phi_2$ of the clock signal.

Referring to FIG. 10, the switch 65 of the D/A stage 60 comprises a first D/A switch element 65a and a second D/A switch element 65b, which can be, for example, respectively a p-type metal oxide semiconductor field effect transistor (MOSFET) and an n-type MOSFET. The first D/A switch element 65a has a source coupled to a positive reference voltage $V_{REF+}$ and a drain coupled to the output 64 of the D/A stage 60. The second D/A switch element 65b has a source coupled to a negative reference voltage $V_{REF-}$ and a drain coupled to the output 64 of the D/A stage 60. Gates of the first and second D/A switch elements 65a, 65b are controlled in response to the digital output signal D at the input 62 of the D/A stage 60, and the inverse of the digital output signal, $\overline{D}$, in order to couple either the positive reference voltage $V_{REF+}$ or the negative reference voltage $V_{REF-}$ to the switchable gain stage 70 via the output 64 of the D/A stage 60 during the first phase $\Phi_1$ of the clock signal to charge the switchable gain stage 70. In particular, if the digital output signal D has a binary '1' value, the positive reference voltage $V_{REF+}$ is coupled to the output 64 of the D/A stage 60, and if the digital output signal D has a binary '0' value, the negative reference voltage $V_{REF-}$ is coupled to the output 64 of the D/A stage 60. In addition, the gates of the first and second D/A switch elements 65a, 65b are controlled to decouple both the positive reference voltage $V_{REF+}$ and the negative reference voltage $V_{REF-}$ from the switchable gain stage 70 during the second phase $\Phi_2$ of the clock signal to enable the switchable gain stage 70 to discharge into the integrator 30.

Continuing to refer to FIG. 10, the switchable gain stage 70 comprises a switchable capacitance stage 76, a controller 77 and an output switch element 78, which can be a MOSFET. The switchable capacitance stage 76, which provides a switchable capacitance value Cref, has a first terminal coupled to the input 72 of the switchable gain stage 70 and a second terminal coupled to a source of the output switch element 78. A drain of the output switch element 78 is coupled to the output 74 of the switchable gain stage 70. The controller 77 has an input coupled to the gain control input 75 of the switchable gain stage 70 for receiving the gain selection signal S, and is coupled to the switchable capacitance stage 76 for controlling the capacitance of the switchable capacitance stage 76 by means of a switching control signal Z. The switchable capacitance stage 76 comprises a fixed capacitive element $C_x$ coupled between the first terminal of the switchable capacitance stage 76 and the second terminal of the switchable capacitance stage 76, and a plurality of selectable capacitive elements $C_1$ to $C_N$ coupled in series with respective selection switch elements $S_1$ to $S_N$ between the first terminal of the switchable capacitance stage 76 and the second terminal of the switchable capacitance stage 76. Each of the selection switch elements $S_1$ to $S_N$ can be, for example, a MOSFET. The selection switch elements $S_1$ to $S_N$ are operable under the control of the controller 77 to couple and decouple one or more of the plurality of selectable capacitive elements $C_1$ to $C_N$ between the input 72 of the switchable gain stage 70 and the source of the output switch element 78. The gain of the delta-sigma ADC 100 is dependent on the capacitance value Cref of the switchable capacitance stage 76. The controller 77 decodes the gain selection signal S, determines the capacitance value Cref required to provide the gain indicated by the gain selection signal, and controls the selection switch elements $S_1$ to $S_N$ to provide the required capacitance value. The gain selection signal S may indicate either a target gain G, or a change in gain, such as −2 dB, from which the controller 77 may calculate the target gain G. Moreover, the controller 77 controls the selection switch elements $S_1$ to $S_N$ by pulse width modulating the switching control signal Z to provide the gain switching between the initial gain G value and target gain G value during the or each transition period T as described above. In a variant of the switchable gain stage 70 illustrated in FIG. 10, the fixed capacitive element $C_x$ may be omitted.

A gate of the output switch element 78 is controlled, by the controller 77 or another control means, so that the output switch element 78 decouples the switchable capacitance stage 76 from the output 74 of the switchable gain stage 70, and therefore from the integrator 30, during the first phase $\Phi_1$ of the clock signal whilst the switchable capacitance stage 76 is charging, and couples the switchable capacitance stage 76 to the output 74 of the switchable gain stage 70, and therefore to the integrator 30, during the second phase $\Phi_2$ of the clock signal.

The table in FIG. 11 illustrates an example of selectable combinations of the selectable capacitive elements $C_1$ to $C_N$, for N=7, for gain settings 1 to 11 providing respective gains 0 to −20 dB in steps of 2 dB in switchable gain stage 70 in the feedback path 80. The capacitance value of the fixed capacitive element $C_x$ is one unit of capacitance, and the capacitance values of the selectable capacitive elements $C_1$ to $C_N$ are, in this example, respectively 0.125, 0.25, 0.50, 1, 2, 4 and 8 units of capacitance. The x's in the table of FIG. 11 represent selection of the selectable capacitive element $C_1$ to $C_N$ in the respective columns for the gain setting of the respective row. The right-hand column of the table indicates the total capacitance units of each selectable combination of the selectable capacitive elements $C_1$ to $C_N$ for each gain setting; the total capacitance is the sum of the capacitance of the fixed capacitive element $C_x$ and the capacitance of the selectable capacitive elements $C_1$ to $C_N$ selected for the gain setting of the respective row. By employing combinations of the selectable capacitive elements $C_1$ to $C_N$, a maximum of $2^N$ gain settings may be provided, or conversely the required number of selectable capacitive elements $C_1$ to $C_N$, and their corresponding selection switch elements $S_1$ to $S_N$, may be minimised. The number of selectable capacitive elements $C_1$ to $C_N$ can be minimised by providing the selectable capacitive elements $C_1$ to $C_N$ with different capacitance values related by an integer power of two, as illustrated in the example of FIG. 11 in which the capacitance value of successive selectable capacitive elements $C_0$ to $C_N$ is doubled, providing the sequence of selectable capacitance values 0.125, 0.25, 0.5, 1, 2, 4, 8. This example can also minimise the chip area require for implementing the selectable capacitive elements $C_1$ to $C_N$ in an integrated circuit.

The table in FIG. 12 illustrates another example of selectable capacitive elements $C_1$ to $C_N$, for N=11, for gain settings 1 to 12 providing respective gains 0 to −22 dB in steps of 2 dB in switchable gain stage 70 in the feedback path 80. The capacitance value of the fixed capacitive element $C_x$ is one unit of capacitance, and the capacitance value of the selectable capacitive elements $C_1$ to $C_N$, are, in this example, respectively 0.25, 0.50, 0.875, 1.375, 2, 2.75, 3.75, 5, 6.625, 8.5 and 11 units of capacitance. The x's in the table of FIG. 12 represent selection of the selectable capacitive element $C_1$ to $C_N$ in the respective column for the gain setting of the respective row. The selectable capacitive elements $C_1$ to $C_N$ are individually selectable, that is, they are not selected in combinations but for each gain setting, only one selectable capacitive element $C_1$ to $C_N$ is selected. The right-hand column of the table indicates the total capacitance units for each selected one of the selectable capacitive elements $C_1$ to $C_N$, corresponding to each gain setting; the total capacitance is the sum of the capacitance of the fixed capacitive element $C_x$ and the capacitance of the respective selectable capacitive element $C_1$ to $C_N$. By employing selectable capacitive elements $C_1$ to $C_N$ which are individually selectable, the capacitance of each of the selectable capacitive elements $C_1$ to $C_N$ may be selected independently, enabling arbitrary gain steps to be implemented with high accuracy. Moreover, this example requires minimum switching activity as only two of the selection switch elements $S_1$ to $S_N$ are operated for each step in gain.

The capacitance values illustrated in the tables of FIGS. 11 and 12 are relative values, and each unit of capacitance may be an arbitrary number of microfarads or milliFarads, depending, for example, on the frequency of the analog input signal $V_{IN}$, the desired frequency of operation of the delta-sigma ADC 100, and the integrated circuit process employed from implementing the delta-sigma ADC 100. In other examples, the fixed capacitive element $C_x$ can have a capacitance value other than one unit of capacitance.

Figure 13:
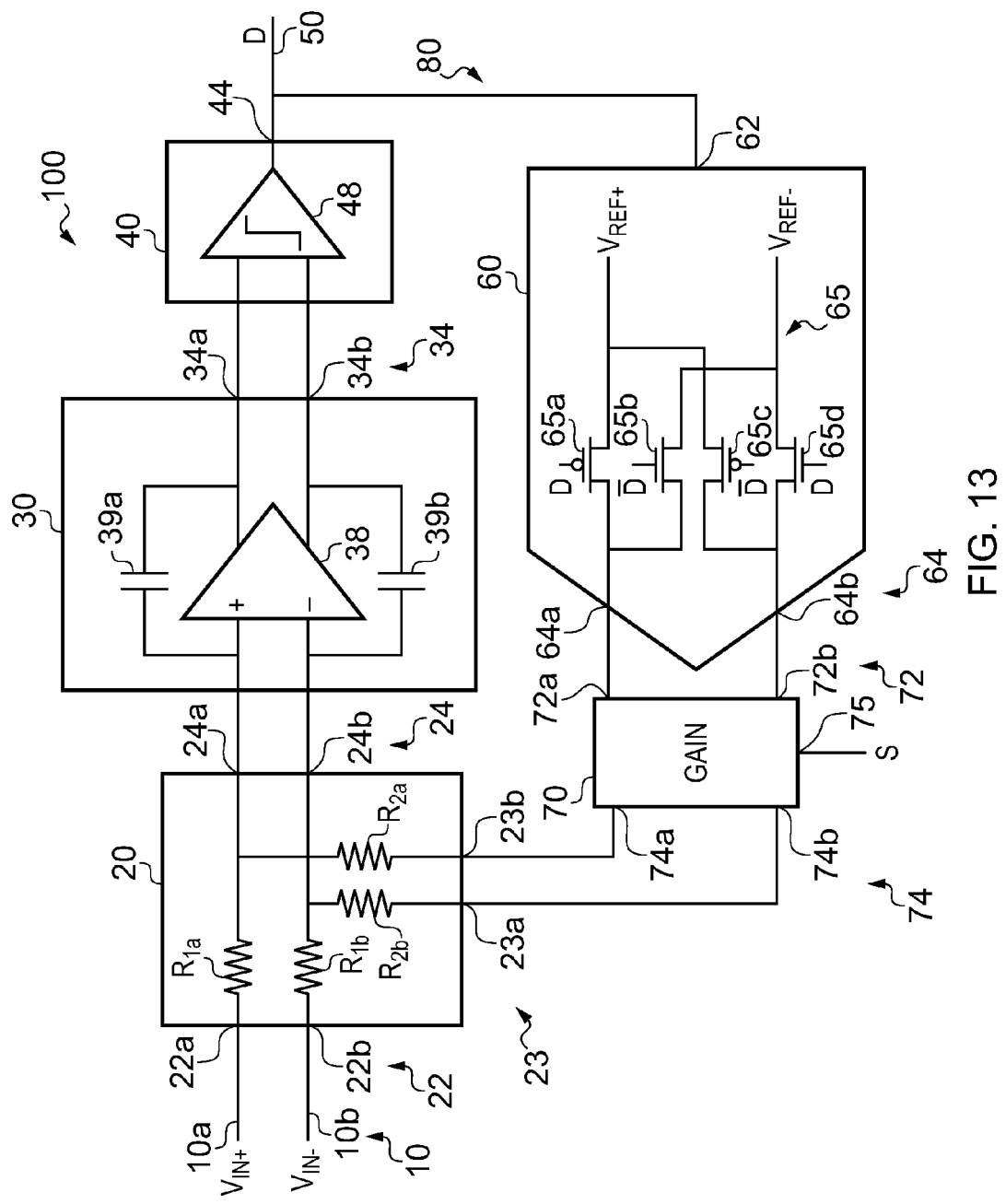
FIG. 13 is a block diagram of a delta-sigma analog-to-digital converter with gain control adapted for processing differential analog signals.

FIG. 13 illustrates an embodiment of the delta-sigma ADC 100 illustrated in FIG. 3 adapted for use with a differential analog input signal $V_{IN}$. Referring to FIG. 13, the ADC input 10 comprises an ADC input pair 10a, 10b for differential components $V_{IN+}$ and $V_{IN-}$ of the analog input signal $V_{IN}$. The ADC output 50 is provided for delivering the digital output signal D. The first input 22 of the summing stage 20 comprises a first input differential pair 22a, 22b of the summing stage 20 coupled to respective components of the ADC input pair 10a, 10b. The output 24 of the summing stage 20 comprises an output differential pair 24a, 24b of the summing stage 20. The input of the integrator 30 comprises an input differential pair for receiving differential signal components. The output 34 of the integrator 30 comprises an output differential pair 34a, 34b of the integrator 30 for delivering differential signal components. Likewise, the output 64 of the D/A stage 60 comprises an output differential pair 64a and 64b of the D/A stage 60 for delivering differential signal components, the first input 72 of the switchable gain stage 70 comprises an input differential pair 72a and 72b of the switchable gain stage 70 receiving differential signal components, and the output 74 of the switchable gain stage 70 comprises an output differential pair 74 and 74b for delivering differential signal components. The second input 23 of the summing stage 20 comprises a second input differential pair 23a, 23b of the summing stage 20 coupled to respective components of the output differential output pair 74a, 74b of the switchable gain stage 70.

The summing stage 20 comprises first input resistive elements $R_{1a}$, $R_{1b}$ coupled between respective elements of the first input differential pair 22a, 22b of the summing stage 20 and respective elements of the output differential pair 24a, 24b of the summing stage 20, and comprises second input resistive elements $R_{2a}$, $R_{2b}$ coupled between respective elements of the second input differential pair 23a, 23b of the summing stage 20 and respective elements of the output differential pair 24a, 24b of the summing stage 20.

The integrator 30 comprises an amplifier 38 having non-inverting and inverting inputs for respective differential signal components, and feedback capacitors 39a, 39b cross-coupled between the non-inverting and inverting inputs and the output differential pair of the integrator 30.

The A/D stage 40 comprises a limiter 48 for generating the digital output signal D as a binary signal indicative of the relative magnitude of the differential signal components at the input differential pair of the A/D stage 40.

The switch 65 of the D/A stage 60 comprises the first and second D/A switch elements 65a, 65b, and third and fourth D/A switch elements 65c, 65d, which can be MOSFETs. The first D/A switch element 65a is coupled between the positive reference voltage $V_{REF+}$ and a first element 64a of the output differential pair 64a, 64b of the D/A stage 60. The second D/A switch element 65b is coupled between the negative reference voltage $V_{REF-}$ and the first element 64a of the output differential pair 64a, 64b of the D/A stage 60. The third D/A switch element 65c is coupled between the positive reference voltage $V_{REF+}$ and the second element 64b of the output differential pair 64a, 64b of the D/A stage 60. The fourth D/A switch element 65d is coupled between the negative reference voltage $V_{REF-}$ and the second element 64b of the output differential pair 64a, 64b of the D/A stage 60.

The first, second, third and fourth D/A switch elements 65a, 65b, 65c, 65d are controlled by the digital output signal D to deliver, for charging the switchable gain stage 70 during the first phase $\Phi_1$ of the clock signal, either the positive reference voltage $V_{REF+}$ to the first element 64a of the output differential pair 64a, 64b of the D/A stage 60 and the negative reference voltage $V_{REF-}$ to the second element 64b of the output differential pair 64a, 64b of the D/A stage 60, or the positive reference voltage $V_{REF+}$ to the second element 64b of the output differential pair 64a, 64b of the D/A stage 60 and the negative reference voltage $V_{REF-}$ to the first element 64a of the output differential pair 64a, 64b of the D/A stage 60, according to whether the digital output signal D present at the input 62 of the D/A stage 60 has a binary '1' value or a binary '0' value. In addition, the gates of the first, second, third and fourth D/A switch elements 65a, 65b, 65c, 65d are controlled to decouple both the positive reference voltage $V_{REF+}$ and the negative reference voltage $V_{REF-}$ from the switchable gain stage 70 during the second phase $\Phi_2$ of the clock signal to enable the switchable gain stage 70 to discharge into the integrator 30.

Figure 14:
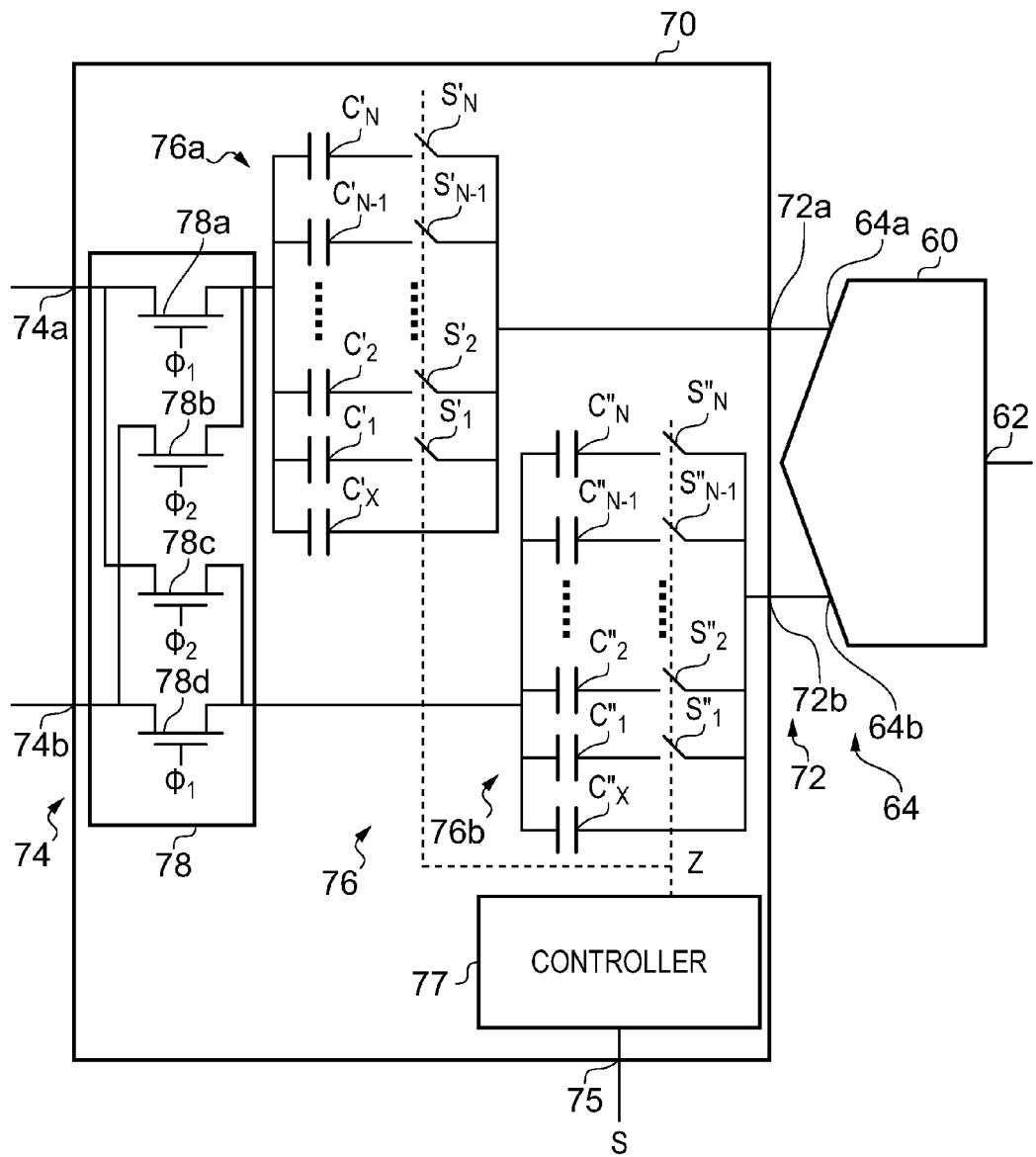
FIG. 14 is a schematic diagram of a feedback path adapted for use with differential analog signals.

FIG. 14 illustrates an embodiment of the feedback path 80 of the delta-sigma ADC 100 illustrated in FIG. 13. The feedback path 80 comprises the D/A stage 60 and the switchable gain stage 70. The D/A stage 60 of FIG. 14 has been described above with reference to FIG. 13. The embodiment of the feedback path 80 illustrated in FIG. 14 is suitable for use in a switched capacitor delta-sigma ADC in which the differential components $V_{IN+}$, $V_{IN-}$ of the analog input signal $V_{IN}$ are sampled by charging respective capacitors during a first phase $\Phi_1$ of a clock signal, and the samples are transferred to the integrator 30 during a second phase $\Phi_2$ of the clock signal.

Continuing to refer to FIG. 14, the switchable capacitance stage 76 of the switchable gain stage 70 comprises a first switchable capacitance element 76a and a second switchable capacitance element 76b, both of which are controlled by the controller 77 by means of the switching control signal Z, and both of which provide a switchable capacitance Cref. The first switchable capacitance element 76a has a first terminal coupled to a first element 72a of the input differential pair 72a, 72b of the switchable gain stage 70 and a second terminal coupled to a first element of an input differential pair of the output switch element 78. A first element of an output differential pair of the output switch element 78 is coupled a first element 74a of the output differential pair 74a, 74b of the output 74 of the switchable gain stage 70. The second switchable capacitance element 76b has a first terminal coupled to a second element 72b of the input differential pair 72a, 72b of the switchable gain stage 70 and a second terminal coupled to a second element of the input differential pair of the output switch element 78. A second element of the output differential pair of the output switch element 78 is coupled a second element 74b of the output differential pair 74a, 74b of the output 74 of the switchable gain stage 70.

The controller 77 has an input coupled to the gain control input 75 of the switchable gain stage 70 for receiving the gain selection signal S, and is coupled to the first and second switchable capacitance elements 76a, 76b of the switchable capacitance stage 76 for controlling the capacitance Cref of the first and second switchable capacitance elements 76a, 76b. The first switchable capacitance element 76a comprises a fixed capacitive element $C'_x$ coupled between the first terminal of the first switchable capacitance element 76a and the second terminal of the first switchable capacitance element 76a, and a plurality of selectable capacitive elements $C'_1$ to $C'_N$ coupled in series with respective selection switch elements $S'_1$ to $S'_N$ between the first terminal of the first switchable capacitance element 76a and the second terminal of the first switchable capacitance element 76a. Each of the selection switch elements $S'_1$ to $S'_N$ of the first switchable capacitance element 76a can be, for example, a MOSFET. These selection switch elements $S'_1$ to $S'_N$ are operable under the control of the controller 77 to couple and decouple one or more of the plurality of the selectable capacitive elements $C'_1$ to $C'_N$ of the first switchable capacitance element 76a between the first element 72a of the input differential pair 72a, 72b of the switchable gain stage 70 and the first element of the output differential pair of the first switchable capacitance element 76a. The second switchable capacitance element 76b comprises a fixed capacitive element $C''_x$ coupled between the first terminal of the second switchable capacitance element 76b and the second terminal of the second switchable capacitance element 76b, and a plurality of selectable capacitive elements $C''_1$ to $C''_N$ coupled in series with respective selection switch elements $S''_1$ to $S''_N$ between the first terminal of the second switchable capacitance element 76b and the second terminal of the second switchable capacitance element 76b. Each of the selection switch elements $S''_1$ to $S''_N$ can be, for example, a MOSFET. These selection switch elements $S''_1$ to $S''_N$ are operable under the control of the controller 77 to couple and decouple one or more of the plurality of the selectable capacitive elements $C''_1$ to $C''_N$ between the second element 72b of the input differential pair 72a, 72b of the switchable gain stage 70 and the second element of the input differential pair of the output switch element 78.

The gain of the delta-sigma ADC 100 is dependent on the capacitance value of the first and second switchable capacitance elements 76a, 76b. The controller 77 decodes the gain selection signal S, determines the capacitance value required to provide the gain indicated by the gain selection signal, and controls the selection switch elements $S'_1$ to $S'_N$ and $S''_0$ to $S''_N$ to provide the required capacitance value of the first and second switchable capacitance elements 76a, 76b. As in the embodiment of FIG. 10, the gain selection signal S may indicate either a target gain G, or a change in gain, such as −2 dB, from which the controller 77 may calculate the target gain G. Moreover, the controller 77 controls the selection switch elements $S'_1$ to $S'_N$ and $S''_1$ to $S''_N$ by pulse width modulating the switching control signal Z to provide the gain switching between the initial gain G value and target gain G value during the or each transition period T as described above. The selection of the selection switch elements $S'_1$ to $S'_N$ and $S''_1$ to $S''_N$ can be in accordance with the table of FIG. 11 or the table of FIG. 12, with the fixed capacitive elements $C'_x$ and $C''_x$ taking the value of the fixed capacitive element $C_x$, and the selectable capacitive elements $C'_1$ to $C'_N$ and $C''_1$ to $C''_N$ taking the values of the selectable capacitive elements $C_1$ to $C_N$. In a variant of the switchable gain stage 70 illustrated in FIG. 10, the fixed capacitive elements $C'_x$ and $C''_x$ may be omitted.

Continuing to refer to FIG. 14, the output switch element 78 comprises a first output switch element 78a coupled between the second terminal of the first switchable capacitance element 76a and the first element 74a of the output differential pair 74a, 74b of the switchable gain stage 70, a second output switch element 78b coupled between the second terminal of the first switchable capacitance element 76a and the second element 74b of the output differential pair 74a, 74b of the switchable gain stage 70, a third output switch element 78c coupled between the second terminal of the second switchable capacitance element 76b and the first element 74a of the output differential pair 74a, 74b of the switchable gain stage 70, and a fourth output switch element 78d coupled between the second terminal of the second switchable capacitance element 76a and the second element 74b of the output differential pair 74a, 74b of the switchable gain stage 70. The first, second, third and fourth output switch elements 78a, 78b, 78c, 78d are controlled, by the controller 77 or another control means, so that the output switch element 78 decouples the first and second switchable capacitance elements 76a, 76b from the output 74 of the switchable gain stage 70, and therefore from the integrator 30, during the first phase $\Phi_1$ of the clock signal, and couples the first and second switchable capacitance elements 76a, 76b to the output 74 of the switchable gain stage 70, and therefore to the integrator 30, during the second phase $\Phi_2$ of the clock signal.

Figure 15:
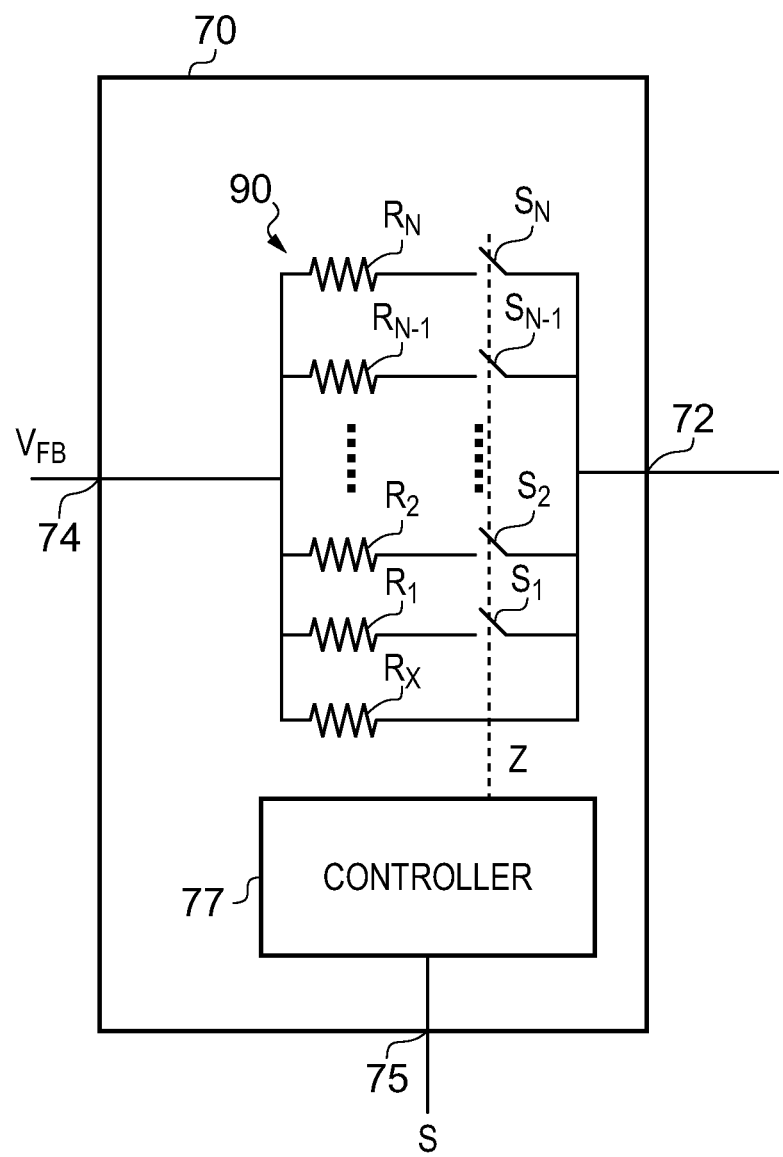
FIG. 15 is a schematic diagram of a switchable gain stage.

Although embodiments of the switchable gain stage 70 have been described which comprise the switchable capacitance stage 76 or the first and second switchable capacitance elements 76a, 76b, these comprising selectable capacitive elements $C_1$ to $C_N$, $C'_1$ to $C'_N$ or $C''_1$ to $C''_N$, alternatively the switchable gain stage 70 may comprise a switchable resistance stage, or first and second switchable resistance elements, comprising selectable resistive elements. In particular, selectable resistive elements can be used in place of the selectable capacitive elements $C_1$ to $C_N$, $C'_1$ to $C'_N$ and $C''_1$ to $C''_N$, as illustrated in FIG. 15. Referring to FIG. 15, a switchable gain stage 70 comprises a switchable resistance stage 90 and the controller 77. The switchable resistance stage 90 has a first terminal coupled to the input 72 of the switchable gain stage 70 and a second terminal coupled to the output 74 of the switchable gain stage 70. The controller 77 is coupled to the gain control input 75 of the switchable gain stage 70 for receiving the gain selection signal S, and is coupled to the switchable resistance stage 90 for controlling the resistance of the switchable resistance stage 90 by means of the switching control signal Z. The switchable resistance stage 90 comprises a fixed resistive element $R_x$ coupled between the first terminal of the switchable resistance stage 90 and the second terminal of the switchable resistance stage 90, and a plurality of selectable resistive elements $R_0$ to $R_N$ coupled in series with the respective selection switch elements $S_1$ to $S_N$ between the first terminal of the switchable resistance stage 90 and the second terminal of the switchable resistance stage 90. The selection switch elements $S_1$ to $S_N$ are operable under the control of the controller 77 to couple and decouple one or more of the plurality of selectable resistive elements $R_1$ to $R_N$ between the input 72 of the switchable gain stage 70 and the output 74 of the switchable gain stage 70. The gain of the delta-sigma ADC 100 is dependent on the resistance value of the switchable resistance stage 90. The controller 77 decodes the gain selection signal S, determines the resistance value required to provide the gain indicated by the gain selection signal, and controls the selection switch elements $S_1$ to $S_N$ to provide the required resistance value. In particular, the controller 77 controls the selection switch elements $S_1$ to $S_N$ by pulse width modulating the switching control signal Z to provide the gain switching between the initial gain G value and target gain G value during the or each transition period T as described above. In a variant of the switchable gain stage 70 illustrated in FIG. 15, the fixed resistive element $R_x$ may be omitted.

Figure 16:
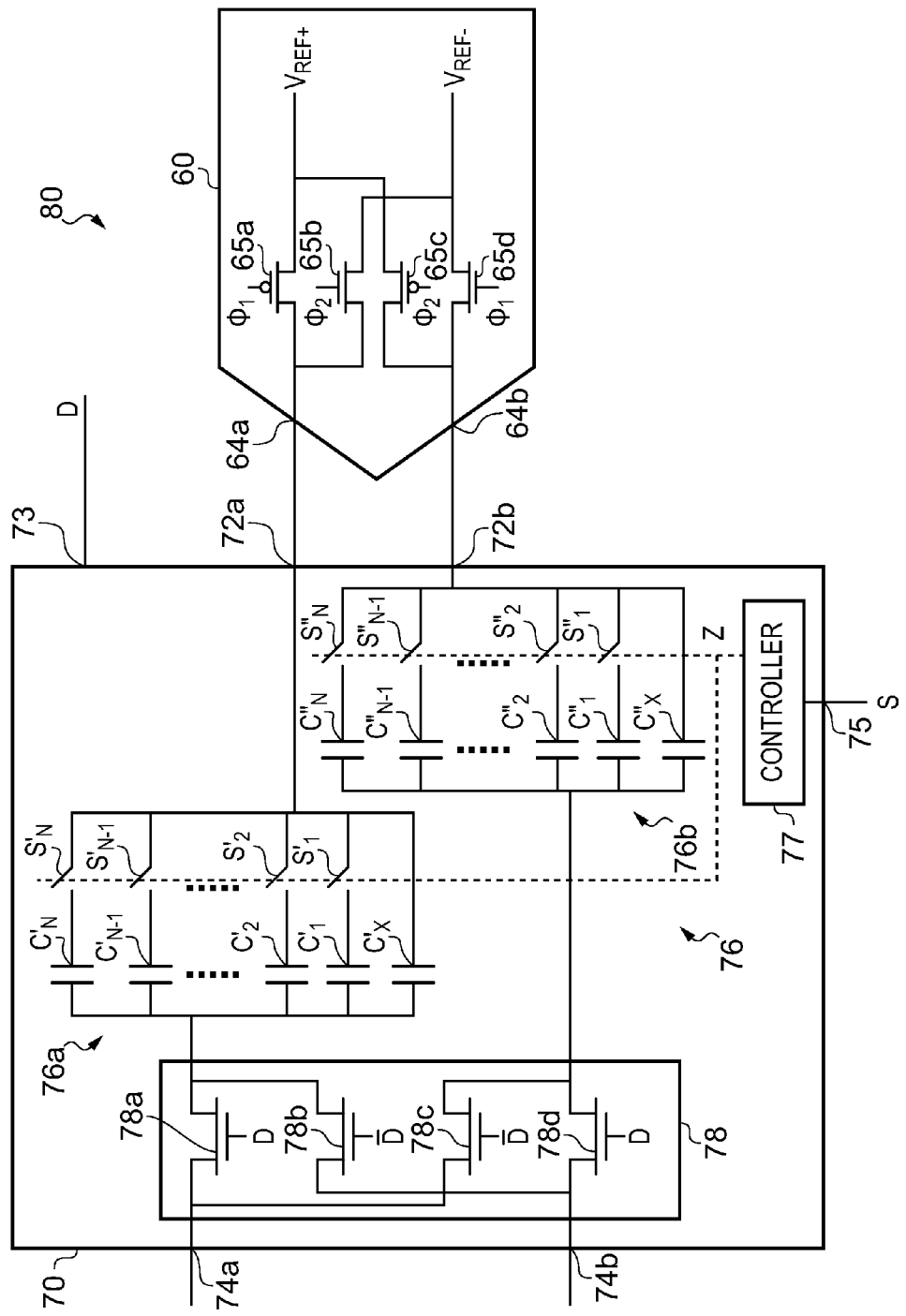
FIG. 16 is a schematic diagram of another feedback path adapted for use with differential analog signals.

FIG. 16 illustrates an alternative configuration of the feedback path 80. Instead of the D/A stage 60 having an input 62 coupled to the output 44 of the A/D stage 40 for receiving the digital output signal D, the switchable gain stage 70 has a third input 73 coupled to the output 44 of the A/D stage 40 for receiving the digital output signal D. The first, second, third and fourth D/A switch elements 65a, 65b, 65c, 65d are controlled, not by the digital output signal D as in the embodiment illustrated in FIG. 14, but by the clock signal, for charging the switchable gain stage 70. During the first phase $\Phi_1$ of the clock signal, the positive reference voltage $V_{REF+}$ is coupled to the first element 64a of the output differential pair 64a, 64b of the D/A stage 60 and the negative reference voltage $V_{REF-}$ is coupled to the second element 64b of the output differential pair 64a, 64b of the D/A stage 60. During the second phase $\Phi_2$ of the clock signal, the positive reference voltage $V_{REF+}$ is coupled to the second element 64b of the output differential pair 64a, 64b of the D/A stage 60 and the negative reference voltage $V_{REF-}$ is coupled to the first element 64a of the output differential pair 64a, 64b of the D/A stage 60. The first, second, third and fourth output switch elements 78a, 78b, 78c, 78d are controlled as follows, by the controller 77 or another control means, dependent on the binary value of the digital output signal D. During the first phase $\Phi_1$ of the clock signal, if the digital output signal D has a binary '1' value, the second terminal of the first switchable capacitance element 76a is coupled to the first element 74a of the output differential pair 74a, 74b of the switchable gain stage 70 and the second terminal of the second switchable capacitance element 76b is coupled to the second element 74b of the output differential pair 74a, 74b of the switchable gain stage 70. During the first phase $\Phi_1$ of the clock signal, if the digital output signal D has a binary '0' value, the second terminal of the first switchable capacitance element 76a is coupled to the second element 74b of the output differential pair 74a, 74b of the switchable gain stage 70 and the second terminal of the second switchable capacitance element 76b is coupled to the first element 74a of the output differential pair 74a, 74b of the switchable gain stage 70. During the second phase $\Phi_2$ of the clock signal, both the first and second switchable capacitance elements 76a, 76b are decoupled from the output differential pair 74a, 74b of the switchable gain stage 70 to enable the first and second switchable capacitance elements 76a, 76b to be charged from the positive or negative reference voltages $V_{REF+}$, $V_{REF-}$.

In a corresponding manner, in a variation of the embodiment of FIG. 10, the first and second D/A switch elements 65a, 65b may be controlled dependent on the binary value of the digital output signal D, and the output switch element 78 may be controlled dependent on the phase of the clock signal.

Figure 17:
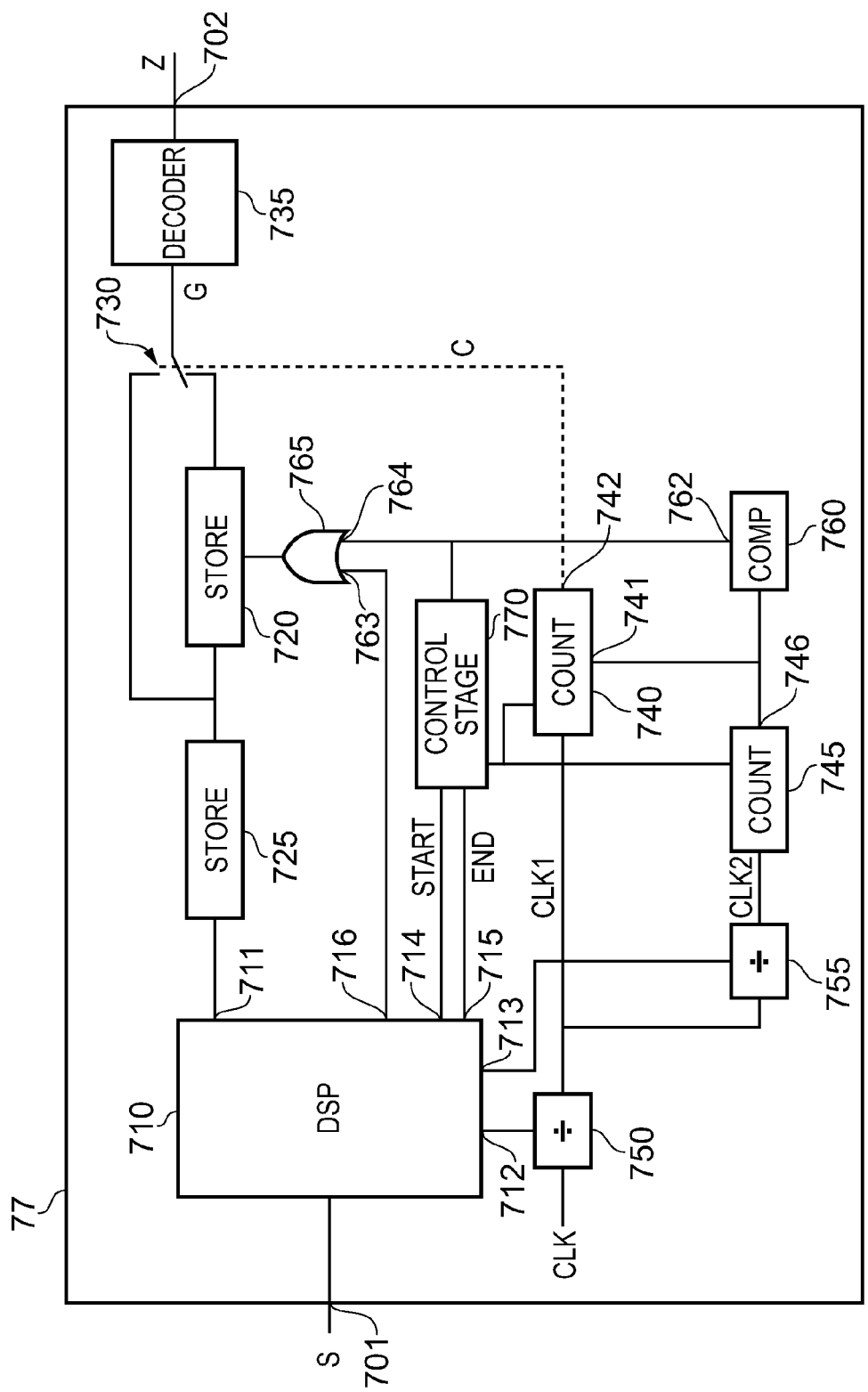
FIG. 17 is a schematic diagram of a controller.

An embodiment of the controller 77 for use in the feedback path described with reference to FIG. 10, and for the selectable combinations of the selectable capacitive elements $C_1 \ldots C_N$ described with reference to FIG. 11 will now be described. Referring to FIG. 17, the controller 77 has a first store 720 for storing a value of the initial gain G and a second store 725 for storing a value of the target gain G. A decoder 735 has an input coupled selectably by means of a selector switch 730 to either the first store 720 for receiving the initial gain value or an output of the second store 725 for receiving the target gain value. The decoder 725 decodes the received value of initial or target gain G to determine the corresponding gain setting 1 to 11 according to the table of FIG. 11, and generates the switching control signal Z for controlling the selection switch elements $S_1$ to $S_N$ selecting one or more of the selectable capacitive elements $C_1 \ldots C_N$ according to the table of FIG. 11. For example, the first and second stores 720, 725 may store as binary values the gain settings 1 to 11 indicated in FIG. 11 which correspond to the initial and target values of the gain G, and the decoder 725 may comprise combinational logic gates to map the stored binary values to the required switching control signal Z. The control of the selector switch 730 for providing interleaving of the values of gain G is described below.

The controller 77 has a controller input 701 for receiving the gain selection signal S. For the present example, it is assumed that the gain selection signal S indicates a target value of the gain G, although alternatively it may indicate an increment in the value of the gain G. A processing stage 710, which may be, for example, a digital signal processor (DSP), has a first input coupled to the controller input 701 for receiving the gain selection signal S, and a first output 711 coupled to the second store 725. On receipt of the gain selection signal S, the processing stage 710 stores the target value of the gain G in the second store 725.

There is a first divider 750 for dividing a clock signal CLK to produce a first divided clock signal CLK1. The frequency of the clock signal CLK may be, for example, equal to a sampling rate of the analog input signal $V_{IN}$. A second divider 755 is coupled to the first divider 750 for dividing the first divided clock signal CLK1 to produce a second divided clock signal CLK2.

A first counter 740 is coupled to the first divider 750 for counting pulses of the first divided clock signal CLK1. For example, the first counter 740 may be a seven-bit counter that counts from 0 to 127. The first counter 740 has an input 741 for a duty cycle indication. The first counter 740 counts repeatedly from 0 to 127, and delivers at an output 742 of the first counter 740 a selector control signal C that is a binary signal indicative of whether the count value of the first counter 740 is greater or less than the duty cycle indication. The output 742 of the first counter 740 is coupled to the selector switch 730 such that the selector control signal C controls the selector switch 730. The duty cycle indication is controlled as described below to progressively increase, thereby progressively changing the duty cycle of the selector control signal C and progressively decreasing the time for which the initial value of the gain G is selected and increasing the time for which the target value of the gain is selected.

A second counter 745 is coupled to the second divider 755 for counting pulses of the second divided clock signal CLK2, which occur at a lower rate than the pulses of the first divided clock signal CLK1. The second counter 745 may be, for example, a seven-bit counter that counts from 0 to 127. The count value of the second counter 745 is the duty cycle indication, and an output 746 of the second counter 745 is coupled to the input 741 of the first counter 740 for delivering the duty cycle indication to the first counter 740.

The division ratio of the second divider 755 affects the duration of the transition period T. The division ratio of the first divider 750 also affects the duration of the transition period T, but also in addition affects the frequency at which the selector control signal C switches between its binary values, and therefore affects the duration of the time periods during which the gain G has its initial value and its target value. In effect, the selector control signal C is pulse width modulated, with the period and duty cycle of the pulse width modulation being determined by the division ratio of the first and second dividers 750, 755, and consequently the switching control signal Z is also pulse width modulated. In the embodiment of FIG. 17, the first divider 750 is coupled to a second output 712 of the processing stage 710 for controlling the division ratio of the first divider 750 and the second divider 755 is coupled to a third output 713 of the processing stage 710 for controlling the division ratio of the second divider 755. The division ratio of the first and second dividers 750, 755 may, for example, be dependent on the frequency of the analog input signal $V_{IN}$ with lower division ratios being selected when the analog input signal $V_{IN}$ has a relatively high frequency.

A control stage 770 is coupled to a fourth output 714 of the processing stage 710 for receiving an indication of when the transition period T is required to start (START), in response to the gain selection signal S at the input 701 of the controller 77. The control stage 770 is coupled to the first and second counters 740, 745 and enables the first and second counters 740, 745 to commence counting at the start of the transition period T, and disables the first and second counters 740, 745 from counting at the end of the transition period T. A comparator stage (COMP) 760 is coupled to the output 746 of the second counter 745 for monitoring the count value of the second counter 745. In response to the count value of the second counter 745 reaching a predetermined value, such as its maximum count value, for example 127, the comparator stage 760 generates an indication at an output 762 of the comparator stage 760, signifying the end of the transition period T. The output 762 of the comparator 760 is coupled to the control stage 770, and in response to the indication signifying the end of the transition period T, the control stage 770 disables the first and second counters 740, 745 from counting and resets their respective count values to zero. The control stage 740 is coupled to a fifth input 715 of the processing stage 710 for reporting the end of the transition period T to the processing stage 710.

The first store 720 is coupled to the second store 725. An OR-gate 765 has a first input 764 coupled to the output 762 of the comparator stage 760 and a second input 763 coupled to a sixth output 716 of the processing stage 710. An output of the OR-gate 765 is coupled to the first store 720, and in response to the indication at the output 762 of the comparator stage 760 signifying the end of the transition period T, or a bypass indication at the sixth output 716 of the processing stage 710, the first store 720 stores the target value of the gain G which is stored in the second store 725, thereby overwriting the initial value of the gain G stored in the first store 720. In this way, at the end of the transition period T, the target value of the gain G replaces the initial value of the gain G, thereby becoming the next value of the initial gain in readiness for the next change of gain to be indicated by the gain selection signal S.

Although an embodiment of the controller 77 has been described with reference to FIG. 17 for the case of a single transition period T, corresponding to the gain G having a single initial value and a single target value, the controller 77 may provide a plurality of successive transition periods T in response to the gain selection signal S, each successive transition period T having a respective initial value and a respective target value of the gain G, and the target value of the gain G of one transition period being equal to the initial value of the gain G for the next transition period. The gain selection signal S may indicate the required steps in gain G, as illustrated in FIG. 6, or alternatively, the processing stage 710 may determine the required steps in gain G, and therefore the required number of transition periods, in response to the gain selection signal S, for example determining that ten steps of 2 dB are required, as illustrated in FIG. 6, if the gain selection signal S indicates a 20 dB change of gain, or that five steps of 2 dB are required if the gain selection signal S indicates a 10 dB change of gain. Alternatively, each change of gain G indicated by the gain selection signal S may be implemented in a single step irrespective of the magnitude of the change. For example a change of 2 dB, 10 db or 20 dB may be implemented using a single transition period T, a single initial value and a single target value of the gain G.

In one example, the analog input signal $V_{IN}$ has a frequency of 5 kHz and the transition period T has a duration of 2 ms, corresponding to ten cycles of the analog input signal $V_{IN}$. The second counter 745 counts from 0 to 127 in 2 ms, and therefore the second divided clock signal CLK2 has a frequency 64 kHz, and the first counter 740 counts from 0 to 127 sixteen times during the transition period T, thereby providing sixteen cycles of the pulse width modulated selector control signal C during the transition period T, and therefore the first divided clock signal CLK1 has a frequency 1024 kHz. These frequencies of the first and second divided clock signals CLK1, CLK2 can be provided by a clock signal CLK having a frequency of 6.144 MHz, in conjunction with a division ratio of 16 in the first divider 750 and a division ratio of 16 in the second divider 755.

In general, the period of time desired for changing the gain G from a current value to a final value may be selected, and then the duration of the or each transition period T within this period, the number of steps in gain G within this period, and the magnitude of these steps, selected accordingly. Alternatively, the duration of the or each transition period T may be selected, and then the period of time required for changing the gain G from a current value to a final value determined by selecting the number of steps in gain G and the magnitude of these steps accordingly.

Figure 18:
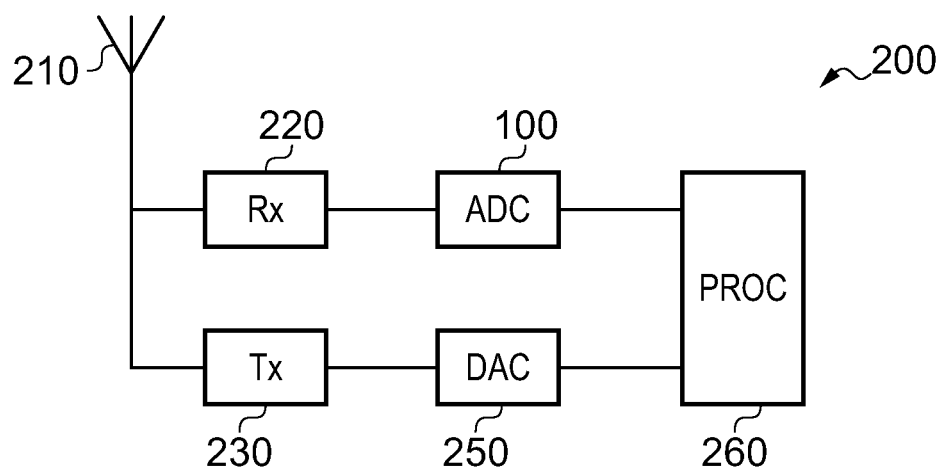
FIG. 18 is a block schematic diagram of a device comprising a delta-sigma analog-to-digital converter.

Referring to FIG. 18, a device 200 comprising a delta-sigma analog-to-digital converter 100 in accordance with the present disclosure comprises an antenna 210 coupled to a receiver (Rx) 220 for receiving wireless signals and coupled to a transmitter (TX) 230 for transmitting wireless signals. The receiver is coupled to the delta-sigma ADC 100 for digitising the received wireless signals. The transmitter 230 is coupled to a digital-to-analog converter (DAC) 250 for converting digital signals into the analog domain for transmission. The delta-sigma ADC 100 and the DAC 250 are coupled to a processor (PROC) 260 for processing digital signals prior to transmission and after reception. The device 200 may be, for example, a mobile phone.

Although the examples described with reference to FIGS. 4 to 9 comprise one or more steps in which the gain G is decreased, such that the initial gain G is larger than the target gain G, other examples can comprise one or more steps in which the gain G is increased, such that the initial gain G is smaller than the target gain G.

Although the examples described with reference to FIGS. 4 to 9 comprise transition periods T having two values of gain, the initial gain G and the target gain G, one or more additional values of gain G may be included in the transition periods T. This feature can enable smoother changes of gain at the output of the delta-sigma ADC 100. In this way, the time periods at the initial gain G are interleaved with the time periods at the target gain G, but need not alternate with the time periods at the target gain G. In other examples, the transition period, or periods, may each comprise only two values of gain, the initial gain G and the target gain G, which alternate.

The values of times and gain G described are examples only, and other values may be employed instead or in addition. For example, in another embodiment the times $t_i$, i=1 to 10, corresponding to equal time intervals of duration Δt at which the gain selection signal S indicates a step in the gain G, may be spaced apart by substantially 0.86 ms.

Although embodiments of delta-sigma ADCs 100 have been described which deliver the digital output signal D as a binary signal, alternatively a non-binary digital output signal D may be provided by arranging for the A/D stage 40 to deliver the digital output signal D as a non-binary signal. Likewise, the D/A stage 60 may be arranged to convert a non-binary digital output signal D to the analog domain.

Although embodiments have been described in which gain control is applied to a first order delta-sigma ADC 100, the same gain control can be applied to higher order delta-sigma ADCs. For example, the feedback path 80 may be used in the third order delta-sigma ADC described with reference to FIG. 2 in order to vary the gain gref.

The fixed capacitive elements $C_x$, $C'_x$ and $C''_x$, and the selectable capacitive elements $C_1$ to $C_N$, $C'_1$ to $C'_N$ and $C''_1$ to $C''_N$ may be implemented as capacitors or any other capacitive devices. Similarly, the fixed resistive element $R_x$ and the selectable resistive elements $R_1$ to $R_N$ may be implemented as resistors or any other resistive devices.

The following paragraphs summarise the disclosure. The present disclosure discloses methods and systems for switching the gain in a delta sigma analog to digital converter (ADC) by a smooth change of the feedback signal to be summed to the input of the ADC. According to exemplary embodiments of the present disclosure this is achieved by controlling the gain step transition using Pulse Width Modulation (PWM) of a switching control signal.

Figure 1:
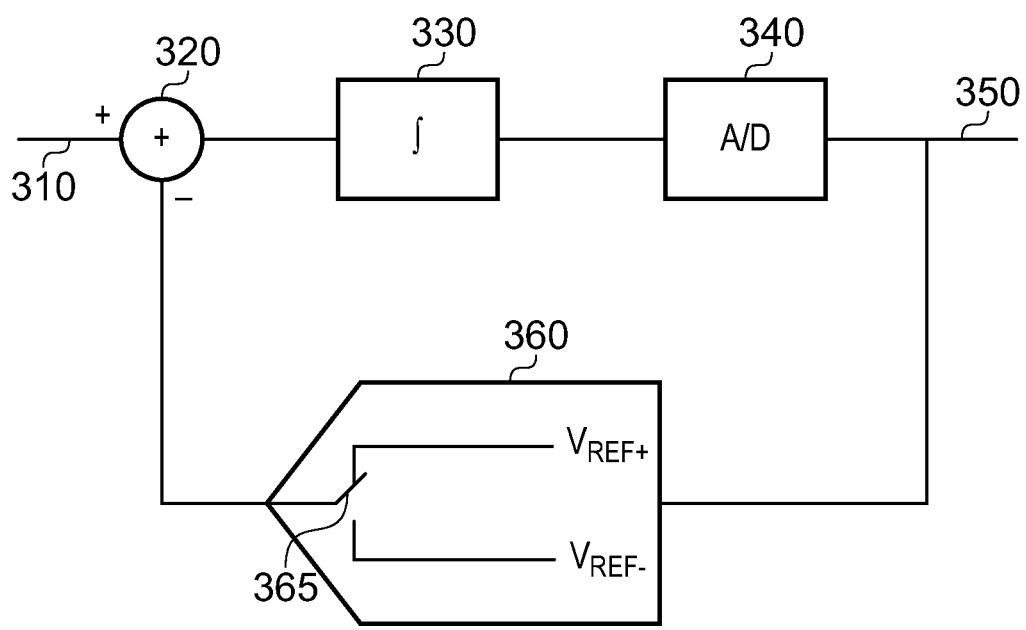
FIG. 1 is a block diagram of a first order delta-sigma analog-to-digital converter.
Figure 2:
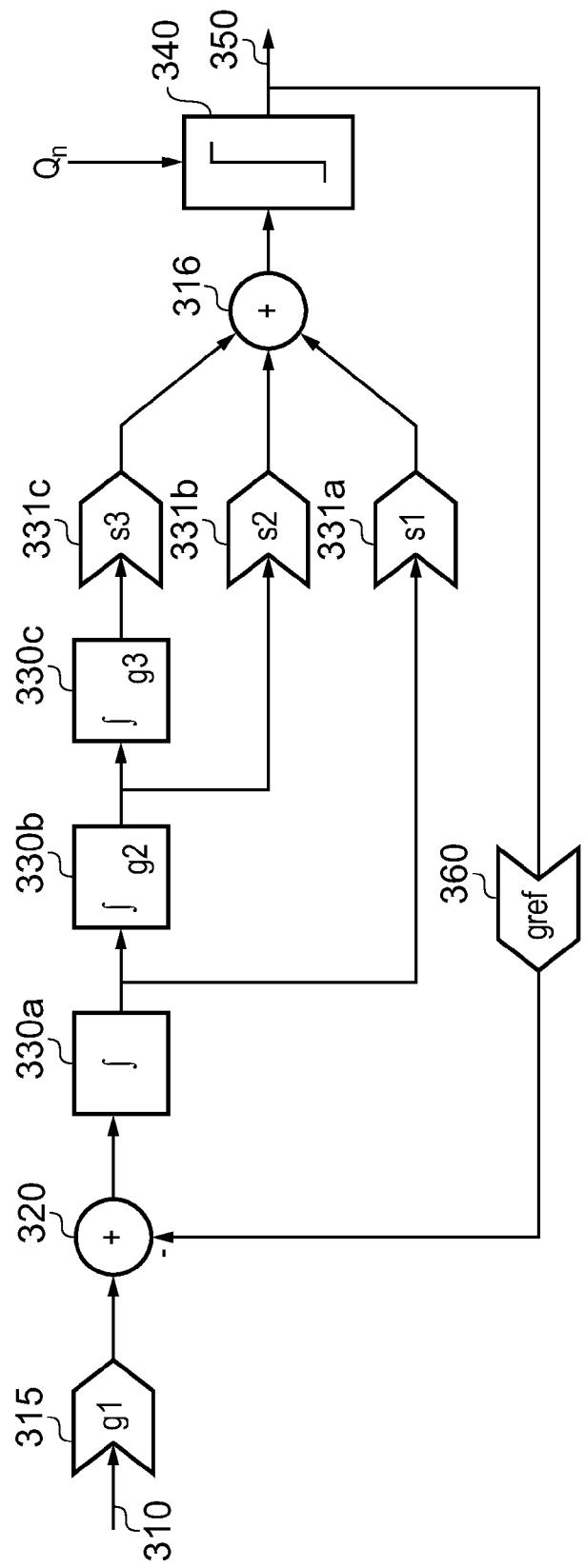
FIG. 2 is a block diagram of a third order feed forward delta-sigma analog-to-digital converter.

For illustrating exemplary embodiments of the present invention, a classical delta sigma architecture is considered, such as for example a third order architecture of a feed forward sigma delta ADC as illustrated in FIG. 2. The disclosed implementation of gain control consists of two parts. The first part consists of a method to switch the gref in steps and the second part is a control part to be placed in a digital control section of the ADC, which will allow a smooth switching of the gain.

According to an embodiment of the present disclosure, in a switching capacitor ADC, the gref coefficient could be implemented by following path to the reference voltages. FIG. 16 illustrates the reference voltage path in a switching capacitor sigma delta ADC. The Cref capacitance may be split into N+1 capacitors, N of which are selectable, to allow the gain stepping, as illustrated in FIG. 16, and each capacitor path may be controlled by a dedicated switch, referred to herein as selection switch elements $S'_1$ to $S'_N$ and $S''_1$ to $S''_N$. In this example, 'N' is the total number of capacitors, and the maximum number of gain paths is $2^N$. A decode block, referred to herein as the controller 77, may be provided to control the switching algorithm to provide a smooth transition between gain steps.

The number of capacitors to be implemented can be minimised by using a binary switching algorithm hence giving to each capacitor path the weight $2^N$ (N∈(0, 1, 2, 3 . . . )). In this case the decode block should implement one of the following switching functions. The table in FIG. 11 illustrates an exemplary switching function implementation, where the number of gain step levels, also referred to herein as gain settings, is 11, N=7 and 'x' indicates the switch ON condition for the selection switch elements $S'_1$ to $S'_N$ and $S''_1$ to $S''_N$ corresponding to each selectable capacitor.

FIG. 6 illustrates an exemplary embodiment of a stepping function applied to the gain control input 75. FIG. 7 illustrates the corresponding decoded output for one of the steps, for illustration each step having a −2 dB amplitude. Rather than switching from 0 to −2 dB at once the transition is done gradually by modulating the width of the pulse controlling the gain amplitude. The effect is a smooth change of the ADC output and a reduction of the audible artifacts when applying this solution to an audio system application.

FIG. 8 illustrates the reconstructed output waveform of the ADC, after filtering, corresponding to a transition from 0 to −20 dB of the feedback signal. As exemplified, the input signal is a −20 dB full-scale input signal and the output scale is in full-scale percentage. FIG. 9 illustrates the waveform in case no PWM is applied to the gain control in the above-discussed exemplary implementation.

According to another embodiment, a dedicated path for each gain step is implemented to switch the gref section. The dedicated path can implement more accurate gain steps. As exemplified according to the embodiment, an 11 steps implementation, from 0 to −20 dB in 2 dB steps requires 10 switching paths and hence more switching and capacitors area. Further the PWM switching algorithm will stay unchanged with respect to the embodiment discussed with respect to FIG. 16. The table in FIG. 12 illustrates the simplified switching function of the decoding block for this exemplary embodiment for case of eleven switchable capacitors.

The present solution can enable switching the gain in a delta sigma ADC by acting on the reference voltage in a reliable and smooth manner and can enable the use of a dedicated programmable gain amplifier to be avoided. One embodiment has the minimum chip area requirement. The binary switching algorithm can enable the number of gain steps to be maximised and capacitors to be shared between different steps hence saving a number of switches and capacitors. Another embodiment can enable uncorrelated steps to be implemented and can enable more controllable errors. It can also require a minimum switching activity as only two switches per gain transition are involved, one path switching off and another path switching on.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A delta-sigma analog-to-digital converter, comprising:
 a summing stage having a first input for an input signal and a second input for a feedback signal;
 an integrator coupled to an output of the summing stage;
 an analog-to-digital conversion stage coupled to an output of the integrator; and
 a switchable gain stage coupled in a feedback path between an output of the analog-to-digital conversion stage and the second input of the summing stage;
 wherein the switchable gain stage is arranged to switch, responsive to a gain selection signal, between a first gain and a second gain via a transition period comprising time periods during which the switchable gain stage has the first gain interleaved with time periods during which the switchable gain stage has the second gain, wherein the time periods at the first gain comprise time periods that decrease in duration over the transition period and the time periods at the second gain comprise time periods that increase in duration over the transition period.

2. The delta-sigma analog-to-digital converter as claimed in claim 1, wherein the switchable gain stage comprises:
 a switchable capacitance stage switchable between a first capacitance value for determining the first gain and a second capacitance value for determining the second gain; and
 a controller for switching the switchable capacitance stage between the first and second capacitance values for the time periods of the transition period.

3. The delta-sigma analog-to-digital converter as claimed in claim 2, wherein the switchable capacitance stage comprises a first capacitive element individually selectable for determining the first capacitance value and a second capacitive element individually selectable for determining the second capacitance value.

4. The delta-sigma analog-to-digital converter as claimed in claim 2, wherein the switchable capacitance stage comprises a plurality of capacitive elements selectable in a first combination for determining the first capacitance value and in a second combination for determining the second capacitance value.

5. The delta-sigma analog-to-digital converter as claimed in claim 2, wherein the switchable capacitance stage comprises a plurality of capacitive elements selectable in a plurality of combinations for determining different capacitance values of the switchable capacitance stage, and wherein the plurality of capacitive elements have different capacitance values related by an integer power of two.

6. The delta-sigma analog-to-digital converter as claimed in claim 1, wherein the switchable gain stage comprises:
 a switchable resistance stage switchable between a first resistance value for determining the first gain and a second resistance value for determining the second gain; and
 a controller for switching the switchable resistance stage between the first and second resistance values for the time periods of the transition period.

7. The delta-sigma analog-to-digital converter as claimed in claim 1, wherein the time periods of the transition period during which the switchable gain stage has the first gain alternate with the time periods of the transition period during which the switchable gain stage has the second gain.

8. The delta-sigma analog-to-digital converter as claimed in claim 1, wherein the feedback path comprises a reference voltage selection means for coupling, responsive to an output signal at the output of the analog-to-digital conversion stage, a first reference voltage or a second reference voltage to the second input via the switchable gain stage.

9. A device comprising the delta-sigma analog-to-digital converter as claimed in claim 1.

10. A method of controlling the gain of a delta-sigma analog-to-digital converter comprising a summing stage having a first input for an input signal and a second input for a feedback signal, an integrator coupled to an output of the summing stage, an analog-to-digital converter coupled to an output of the integrator and a switchable gain stage coupled in a feedback path between an output of the analog-to-digital conversion stage and the second input of the summing stage, the method comprising:
 switching the switchable gain stage, responsive to a gain selection signal, between a first gain and a second gain via a transition period comprising time periods during which the switchable gain stage is at the first gain interleaved with time periods during which the switchable gain stage is at the second gain, wherein the time periods at the first gain comprise periods that decrease in duration over the transition period and the time periods at the second gain comprise periods that increase in duration over the transition period.

11. A system for switching the gain in a delta-sigma analog-to-digital converter, the system comprising a switchable gain stage which includes a decode block for, responsive to a step function applied to a gain control input, pulse width modulating a switching control signal controlling the gain amplitude including a first gain amplitude and a second gain amplitude with a transition period comprising time periods during which the first gain amplitude is interleaved with time periods of the second gain amplitude, wherein the time periods at the first gain amplitude comprise time periods that decrease in duration over the transition period and the time periods at the second gain comprise time periods that increase in duration over the transition period.

12. The system as claimed in claim 11, comprising a plurality of capacitors each controlled by a dedicated switch to allow gain stepping.

13. The system as claimed in claim 12, wherein the plurality of capacitors are selectable individually.

14. The system as claimed in claim 12, wherein the plurality of capacitors are selectable in a plurality of combinations.

15. The system as claimed in claim 12, wherein the plurality of capacitors have the weight 2N, N$\epsilon$.

16. A method for switching the gain in a delta-sigma analog-to-digital converter, comprising, responsive to a step function applied to a gain control input, pulse width modulating a switching control signal controlling the gain amplitude including a first gain amplitude and a second gain amplitude with a transition period comprising time periods during which the first gain amplitude is interleaved with time periods of the second gain amplitude, wherein the time periods at the first gain amplitude comprise time periods that decrease in duration over the transition period and the time periods at the second gain comprise time periods that increase in duration over the transition period.

17. The method as claimed in claim 16, comprising a plurality of capacitors each controlled by a dedicated switch to allow gain stepping.

18. The method as claimed in claim 17, wherein the plurality of capacitors are selectable individually.

19. The method as claimed in claim 17, wherein the plurality of capacitors are selectable in a plurality of combinations.

20. The method as claimed in claim 17, wherein the plurality of capacitors have the weight 2N, N$\epsilon$.

* * * * *